United States Patent
Hsu et al.

(10) Patent No.: US 12,009,049 B2
(45) Date of Patent: Jun. 11, 2024

(54) NON-VOLATILE MEMORY WITH SHARED DATA TRANSFER LATCHES

(71) Applicant: SanDisk Technologies LLC, Addison, TX (US)

(72) Inventors: Hua-Ling Cynthia Hsu, Fremont, CA (US); YenLung Li, San Jose, CA (US); Siddarth Naga Murty Bassa, San Jose, CA (US); Jeongduk Sohn, San Ramon, CA (US)

(73) Assignee: SanDisk Technologies LLC, Addison, TX (US)

( * ) Notice: Subject to any disclaimer, the term of this patent is extended or adjusted under 35 U.S.C. 154(b) by 100 days.

(21) Appl. No.: 17/900,066

(22) Filed: Aug. 31, 2022

(65) Prior Publication Data

US 2024/0071433 A1    Feb. 29, 2024

(51) Int. Cl.
*G11C 7/10* (2006.01)
(52) U.S. Cl.
CPC .......... *G11C 7/1057* (2013.01); *G11C 7/1048* (2013.01); *G11C 2207/101* (2013.01)

(58) Field of Classification Search
CPC ................ G11C 7/1057; G11C 7/1048; G11C 2207/101
See application file for complete search history.

(56) References Cited

U.S. PATENT DOCUMENTS

| | | | |
|---|---|---|---|
| 9,552,882 B2 | 1/2017 | Tseng et al. | |
| 10,481,816 B2 | 11/2019 | Shlick et al. | |
| 10,642,513 B2 | 5/2020 | Marcu et al. | |
| 10,825,526 B1 * | 11/2020 | Li | G11C 16/24 |
| 2014/0211566 A1 | 7/2014 | Kono | |
| 2023/0368852 A1 * | 11/2023 | Kitamura | G11C 11/5628 |

* cited by examiner

*Primary Examiner* — Xiaochun L Chen
(74) *Attorney, Agent, or Firm* — Vierra Magen Marcus LLP

(57) ABSTRACT

An apparatus includes a control circuit that is configured to connect to an array of non-volatile memory cells. The control circuit includes a first plurality of data latches configured to connect to non-volatile memory cells of a first plane and a second plurality of data latches configured to connect to non-volatile memory cells of a second plane. The control circuit also includes a shared data transfer data latch configured for transfer of data with the first plurality of data latches and the second plurality of data latches.

20 Claims, 21 Drawing Sheets

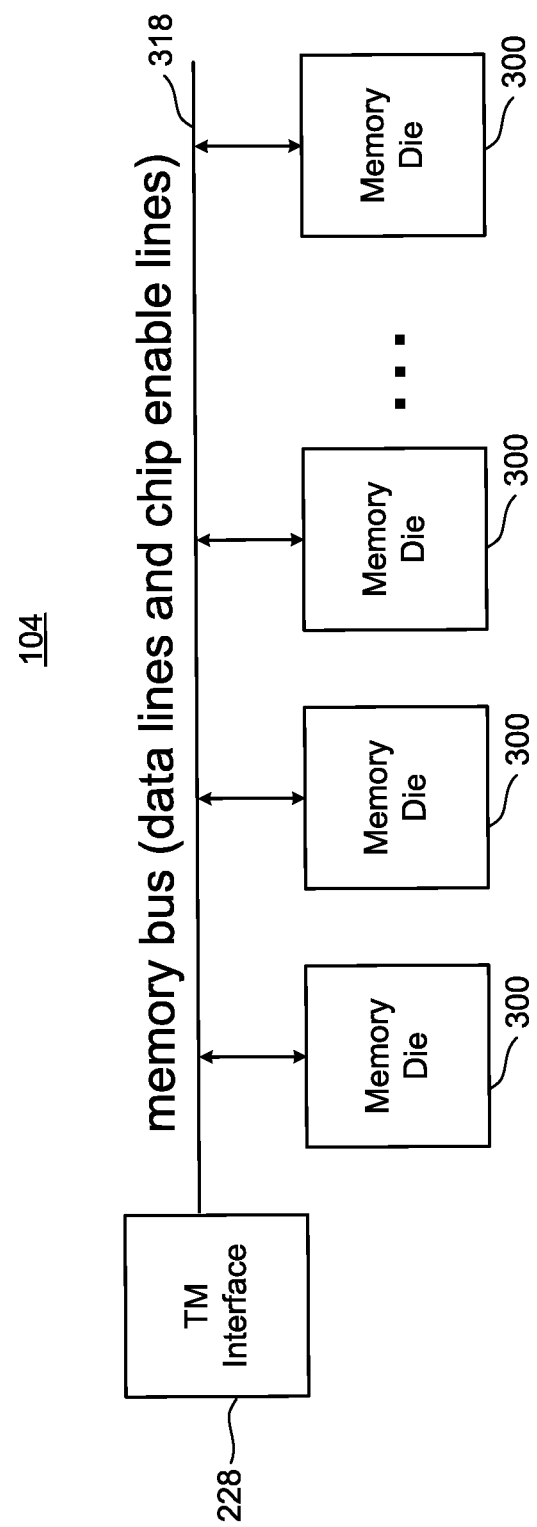

Figure 7A
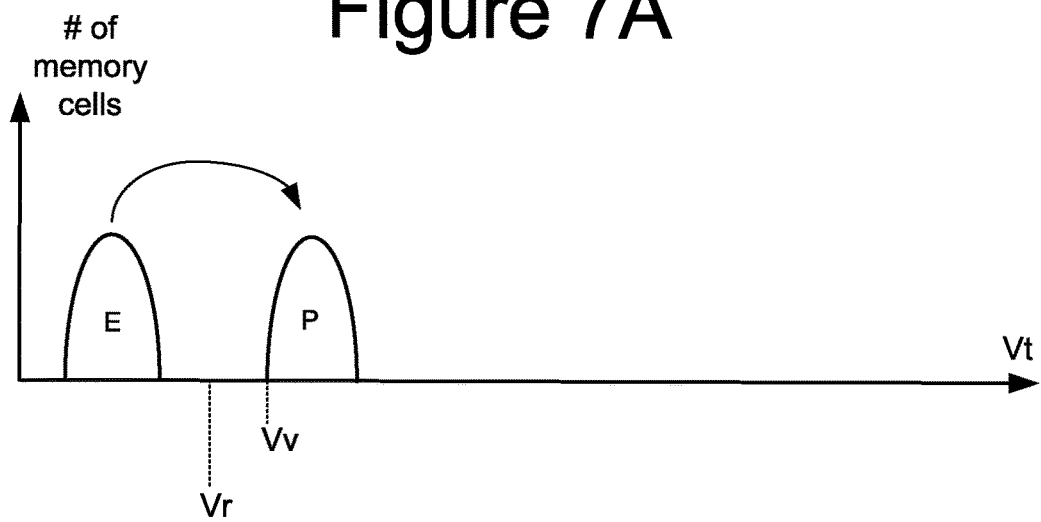
Figure 7B
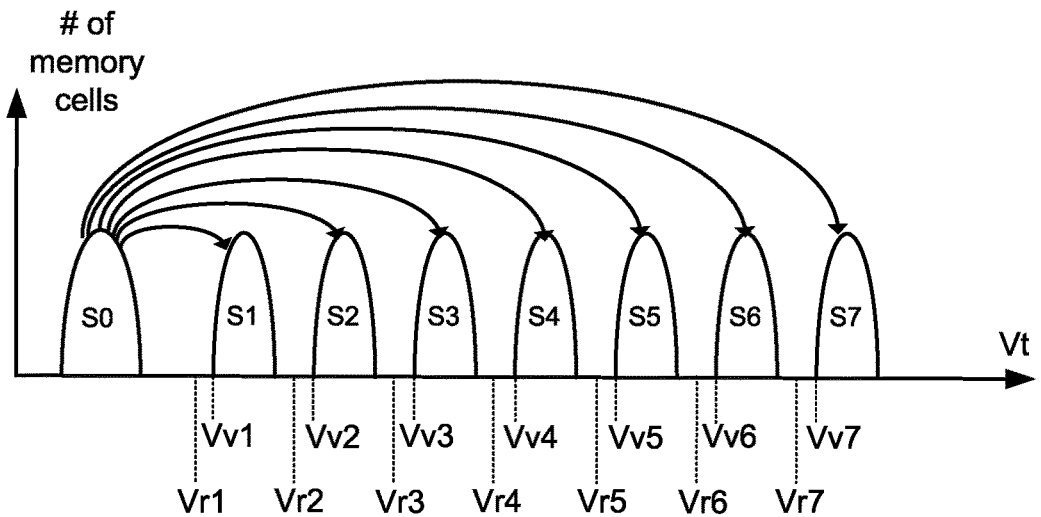
Figure 7C
|            | S0 | S1 | S2 | S3 | S4 | S5 | S6 | S7 |
|------------|----|----|----|----|----|----|----|----|
| Upper Page | 1  | 1  | 1  | 0  | 0  | 0  | 0  | 1  |
| Middle Page| 1  | 1  | 0  | 0  | 1  | 1  | 0  | 0  |
| Lower Page | 1  | 0  | 0  | 0  | 0  | 1  | 1  | 1  |

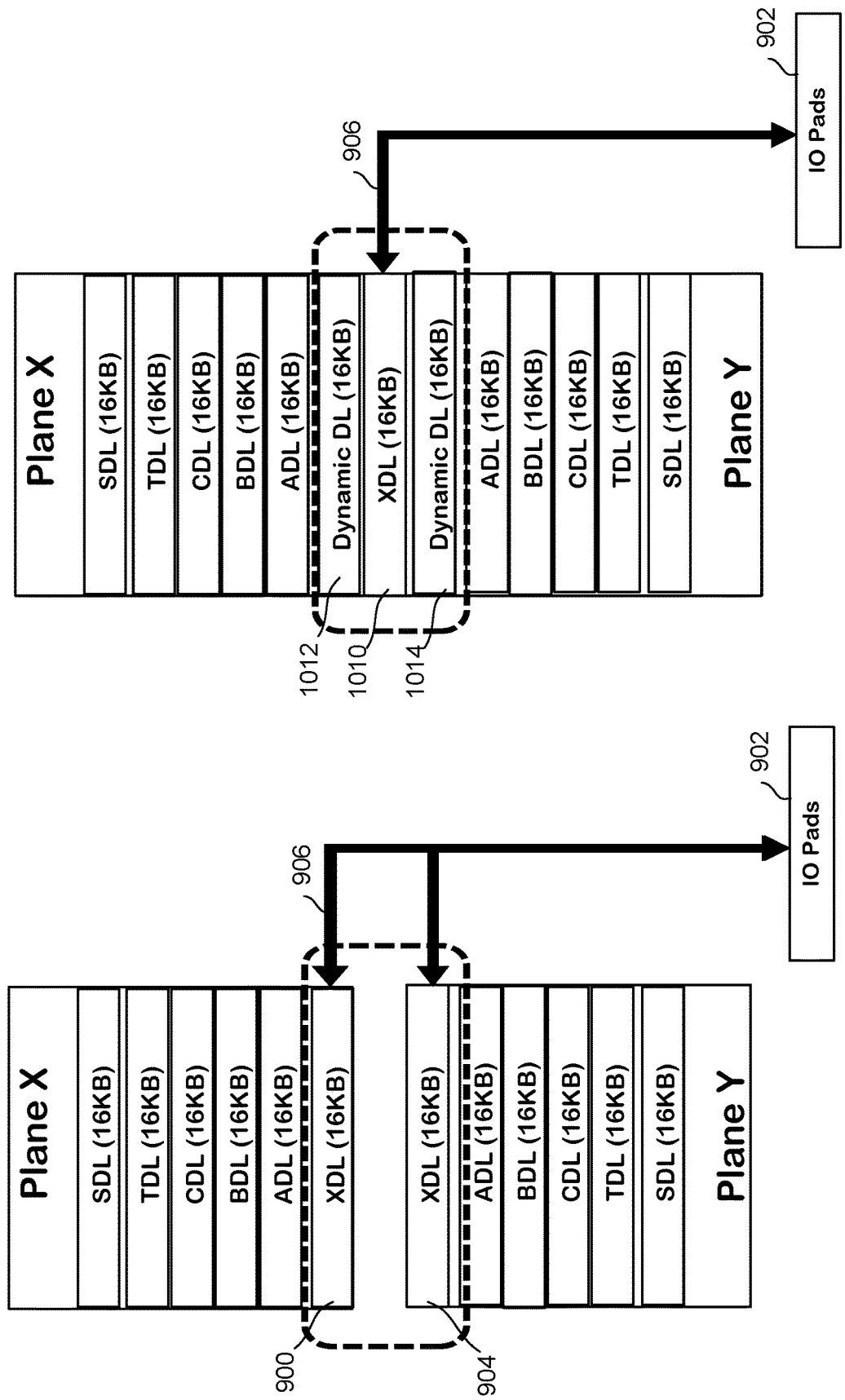

Figure 13A

| QLC memory | | |
|---|---|---|
| Design Latches | Dedicated XDL | Shared XDL architecture |
| XDL | 16 states code | User access only (Shared between planes) |
| ADL | | 16 states code |
| BDL | | |
| CDL | | |
| Dynamic DL | X | |
| TDL | QPW | QPW |
| SDL | Sensing/BL control | Sensing/BL control |

Figure 13B

| TLC memory | | |
|---|---|---|
| Design Latches | Dedicated XDL | Shared XDL architecture |
| XDL | User Cache | User access only (Shared between planes) |
| ADL | 8 states code | 8 states code |
| BDL | | |
| CDL | | |
| Dynamic Latch | X | Optional |
| TDL | QPW | QPW |
| SDL | Sensing/BL control | Sensing/BL control |

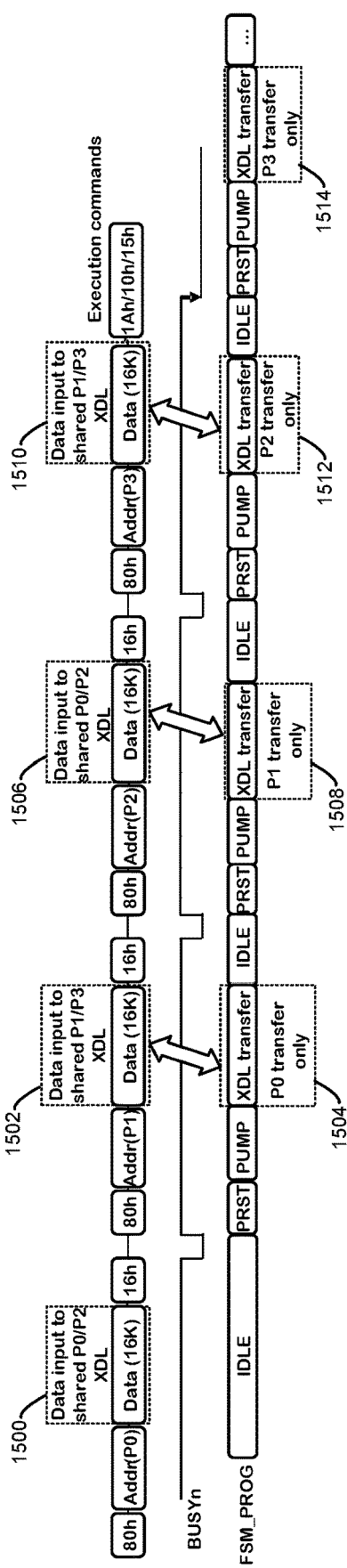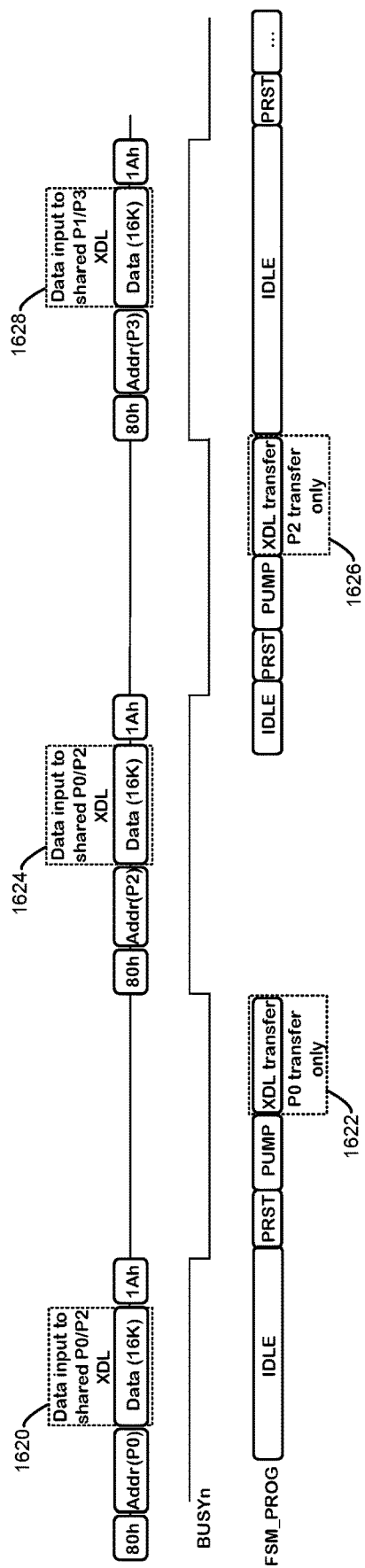

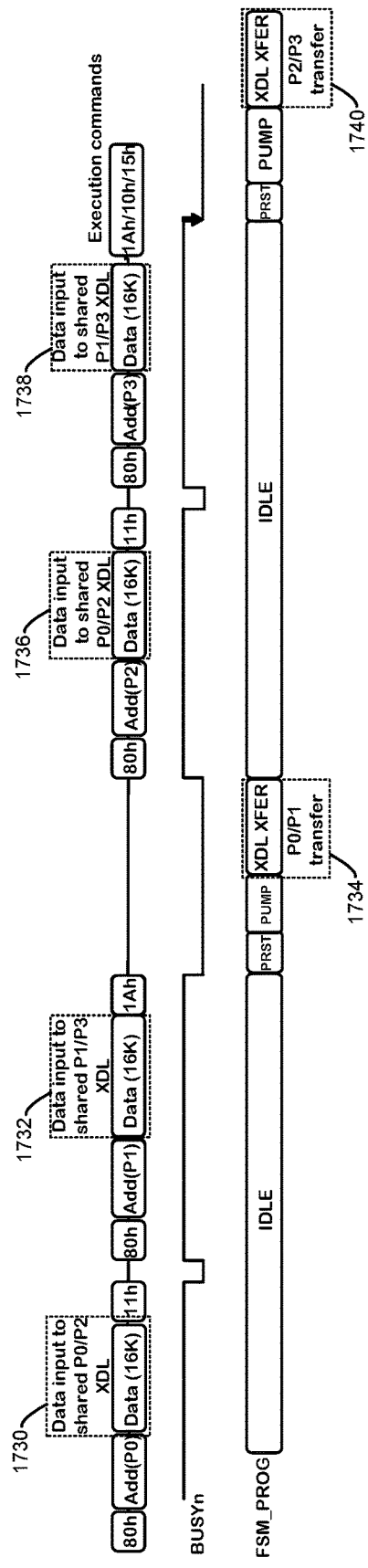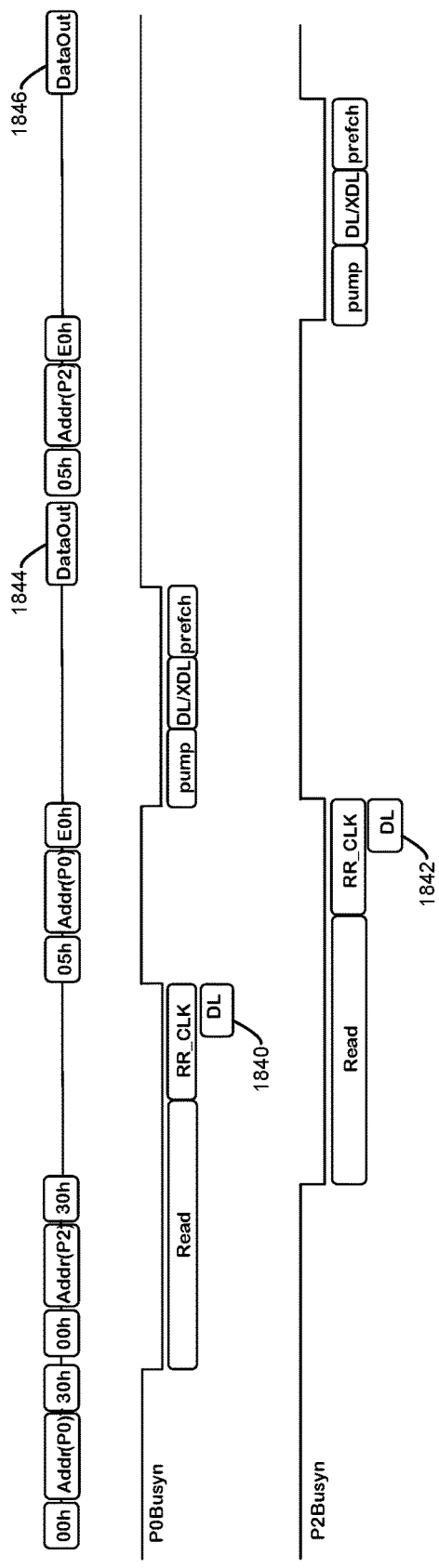

NON-VOLATILE MEMORY WITH SHARED DATA TRANSFER LATCHES

BACKGROUND

The present disclosure relates to technology for non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). An example of non-volatile memory is flash memory (e.g., NAND-type and NOR-type flash memory). Users of non-volatile memory typically want the memory to operate at high speeds so that they do not need to wait for memory operations to be completed.

BRIEF DESCRIPTION OF THE DRAWINGS

Like-numbered elements refer to common components in the different figures.

FIG. 2B is a block diagram of one embodiment of a memory package.

FIG. 7A depicts threshold voltage distributions of memory cells in a binary embodiment.

FIG. 7B depicts threshold voltage distributions of memory cells in a Tri-Level Cell (TLC) embodiment.

FIG. 7C is a table describing one example of an assignment of data values to data states for a TLC embodiment.

FIG. 9 shows an example of two planes, each with a dedicated set of data transfer latches.

FIG. 10 shows an example of two planes that share a common set of data transfer latches.

FIGS. 13A-B illustrate implementation of data latches, including Dynamic data latches, in QLC and TLC memories.

FIG. 15 illustrates an example of a program operation using shared data transfer latches.

FIG. 16 illustrates an example of a program operation using shared data transfer latches, which may accommodate a range of program ordering.

FIG. 17 illustrates another example of a program operation using shared data transfer latches.

FIG. 18 illustrates an example of a read operation using shared data transfer latches.

DETAILED DESCRIPTION

In a storage system, data latches may be used to store data that is written in non-volatile memory cells in a program (write) operation and to store data that is read from non-volatile memory cells in a read operation. Several sets (e.g., rows) of data latches may be provided to facilitate programming and writing of data (e.g., programming and reading more than one bit per cell). Each plane of a multi-plane memory may be connected to respective sets of latches. In some cases, two or more internal data latches are connected to a sense amplifier and to a data transfer data latch, which may be connected to a data bus that allows data to be transferred to and from the internal latches (e.g., for program and read operations). While each plane may have a dedicated data transfer data latch in some cases, in examples of the present technology a data transfer data latch may be shared by two planes. Such shared (common) data transfer data latches may efficiently use space on a die on which latches are formed. In some examples that include a common data transfer data latch shared by two planes, a dynamic data latch may be implemented in each plane to facilitate certain operations. The combination of a shared data transfer data latch and two dynamic data latches for a pair of planes may occupy less area than two dedicated data transfer data latches so that such an arrangement may efficiently use space. Storage systems that include shared data transfer data latches may implement operations (e.g., program and read operations) in ways that are adapted for use of the shared data transfer data latches. Aspects of the present technology provide solutions to technical problems related to implementing data latches in an area-efficient manner and operation of such data latches (e.g., during read and program operations).

FIGS. 1A-6 describe one example of a storage system that can be used to implement the technology disclosed herein.

Figure 1A:
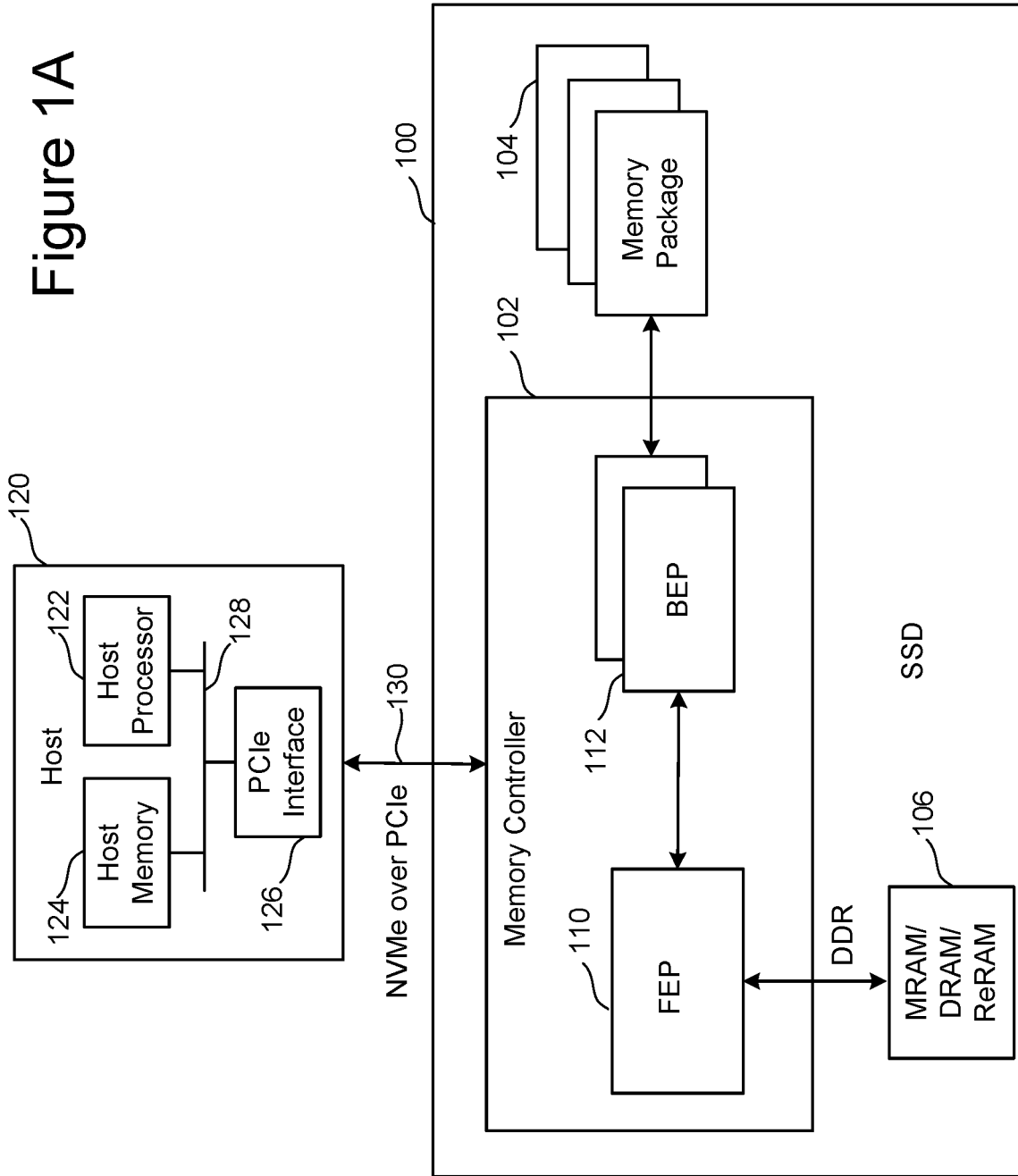
FIG. 1A is a block diagram of one embodiment of a storage system connected to a host.

FIG. 1A is a block diagram of one embodiment of a storage system 100 connected to a host system 120. Storage system 100 can implement the technology disclosed herein. Many different types of storage systems can be used with the technology disclosed herein. One example storage system is a solid state drive ("SSD"); however, other types of storage systems can also be used. Storage system 100 comprises a memory controller 102, memory package 104 for storing data, and local memory (e.g., MRAM/DRAM/ReRAM) 106. Memory controller 102 comprises a Front End Processor Circuit (FEP) 110 and one or more Back End Processor Circuits (BEP) 112. In one embodiment FEP 110 circuit is implemented on an ASIC. In one embodiment, each BEP circuit 112 is implemented on a separate ASIC. The ASICs for each of the BEP circuits 112 and the FEP circuit 110 are implemented on the same semiconductor such that the memory controller 102 is manufactured as a System on a Chip ("SoC"). FEP 110 and BEP 112 both include their own processors. In one embodiment, FEP 110 and BEP 112 work as a master slave configuration where the FEP 110 is the master, and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory package 104 at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages. Memory controller 102 is one example of a control circuit.

In one embodiment, there are a plurality of memory packages 104. Each memory package 104 may contain one or more memory dies. In one embodiment, each memory die in the memory package 104 utilizes NAND flash memory (including two dimensional NAND flash memory and/or three dimensional NAND flash memory). In other embodiments, the memory package 104 can include other types of memory; for example, the memory package can include Phase Change Memory (PCM) memory.

In one embodiment, memory controller 102 communicates with host system 120 using an interface 130 that implements NVM Express (NVMe) over PCI Express (PCIe). For working with storage system 100, host system 120 includes a host processor 122, host memory 124, and a PCIe interface 126, which communicate over bus 128. Host memory 124 is the host's physical memory, and can be DRAM, SRAM, non-volatile memory or another type of storage. Host system 120 is external to and separate from storage system 100. In one embodiment, storage system 100 is embedded in host system 120. In other embodiments, the controller 102 may communicate with host system 120 via other types of communication buses and/or links, including for example, over an NVMe over Fabrics architecture, or a cache/memory coherence architecture based on Cache Coherent Interconnect for Accelerators (CCIX), Compute Express Link (CXL), Open Coherent Accelerator Processor Interface (OpenCAPI), Gen-Z and the like. For simplicity, the example embodiments below will be described with respect to a PCIe example.

Figure 1B:
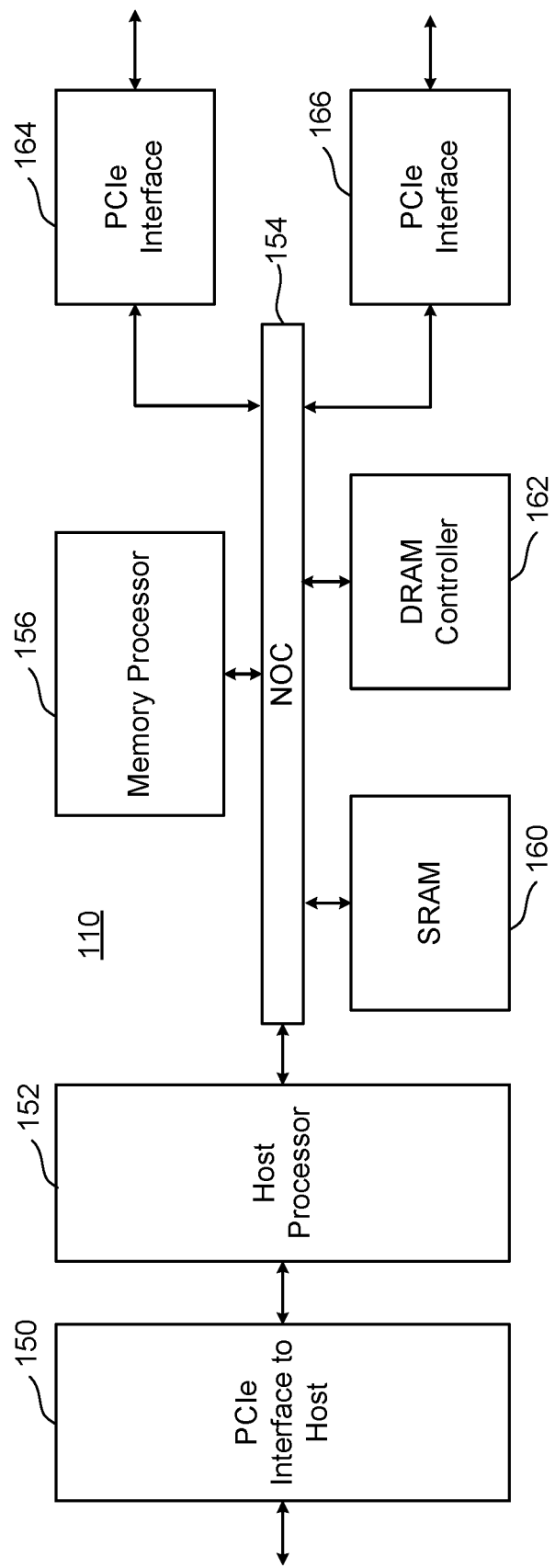
FIG. 1B is a block diagram of one embodiment of a Front End Processor Circuit.

FIG. 1B is a block diagram of one embodiment of FEP circuit 110. FIG. 1B shows a PCIe interface 150 to communicate with host system 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use un-clocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the local memory 106 (e.g., DRAM/MRAM/ReRAM). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 1B, memory controller 102 includes two BEP circuits 112; therefore, there are two PCIe Interfaces 164/166. Each PCIe Interface communicates with one of the BEP circuits 112. In other embodiments, there can be more or fewer than two BEP circuits 112; therefore, there can be more than two PCIe Interfaces.

Figure 2A:
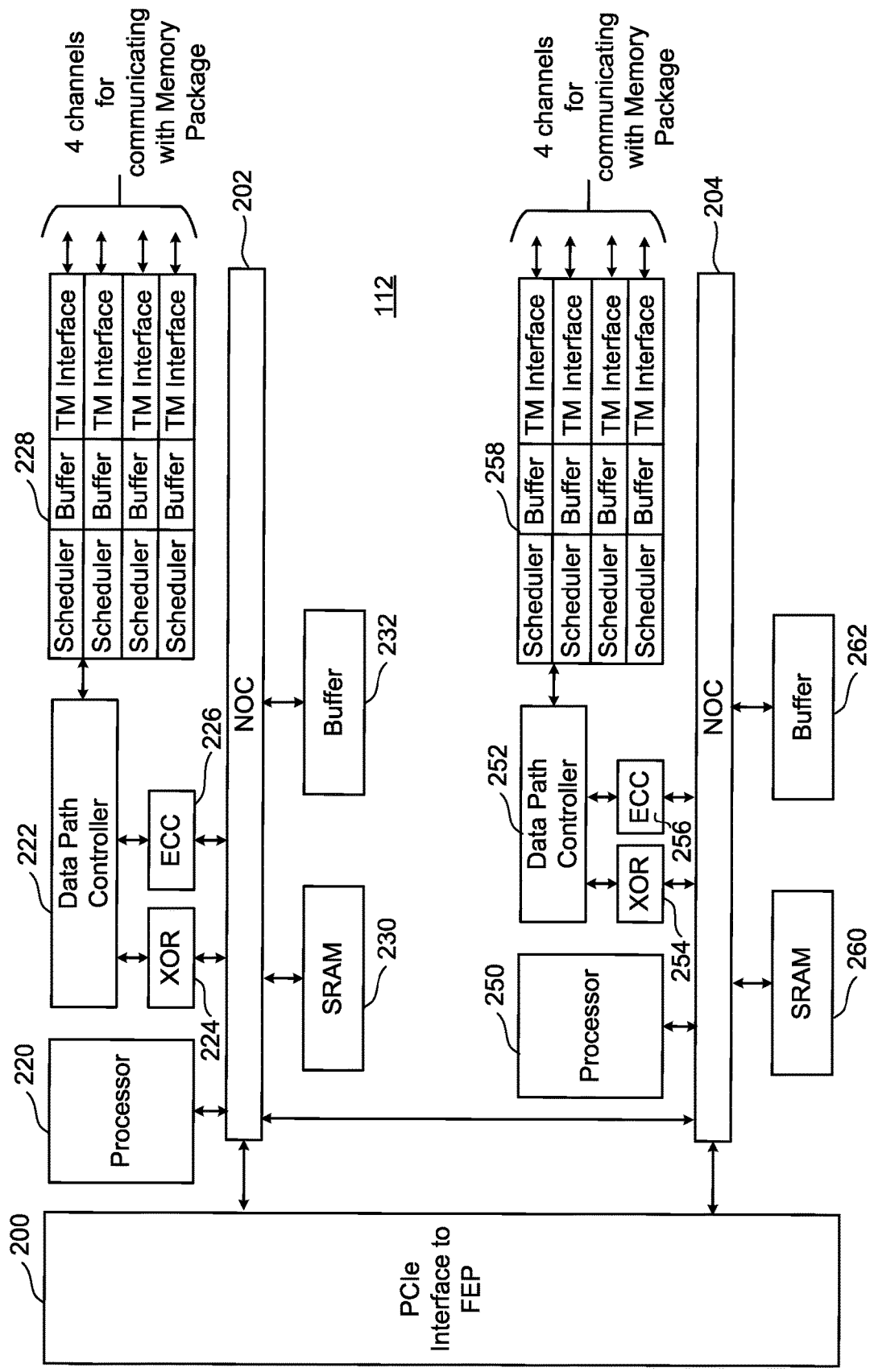
FIG. 2A is a block diagram of one embodiment of a Back End Processor Circuit.

FIG. 2A is a block diagram of one embodiment of the BEP circuit 112. FIG. 2A shows a PCIe Interface 200 for communicating with the FEP circuit 110 (e.g., communicating with one of PCIe Interfaces 164 and 166 of FIG. 1B). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254), an ECC engine (226/256).

The ECC engines 226/256 are used to perform error correction, as known in the art. Herein, the ECC engines 226/256 may be referred to as controller ECC engines. The XOR engines 224/254 are used to XOR the data so that data can be combined and stored in a manner that can be recovered in case there is a programming error. In an embodiment, the XOR engines 224/254 are able to recover data that cannot be decoded using ECC engine 226/256.

Data path controller 222 is connected to a memory interface 228 for communicating via four channels with integrated memory assemblies. Thus, the top NOC 202 is associated with memory interface 228 for four channels for communicating with integrated memory assemblies and the bottom NOC 204 is associated with memory interface 258 for four additional channels for communicating with integrated memory assemblies. In one embodiment, each memory interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254, ECC engines 226/256 can be implemented in software. The scheduler, buffer, and TM Interfaces are hardware circuits. In other embodiments, the memory interface (an electrical circuit for communicating with memory dies) can be a different structure than depicted in FIG. 2A. Additionally, controllers with structures different than FIGS. 1B and 2A can also be used with the technology described herein.

FIG. 2B is a block diagram of one embodiment of a memory package 104 that includes a plurality of memory dies 300 connected to a bus (data lines and chip enable lines) 318. The data bus 318 (memory bus) connects to a Toggle Mode Interface 228 for communicating with the TM Interface of a BEP circuit 112 (see e.g., FIG. 2A). In some embodiments, the memory package can include a small controller connected to the memory bus and the TM Interface. In total, the memory package 104 may have eight or sixteen memory die; however, other numbers of memory die can also be implemented. The technology described herein is not limited to any particular number of memory die. In some embodiments, the memory package can also include a processor, CPU device, such as a RISC-V CPU along with some amount of RAM to help implement some of capabilities described below. The technology described herein is not limited to any particular number of memory die.

Figure 3A:
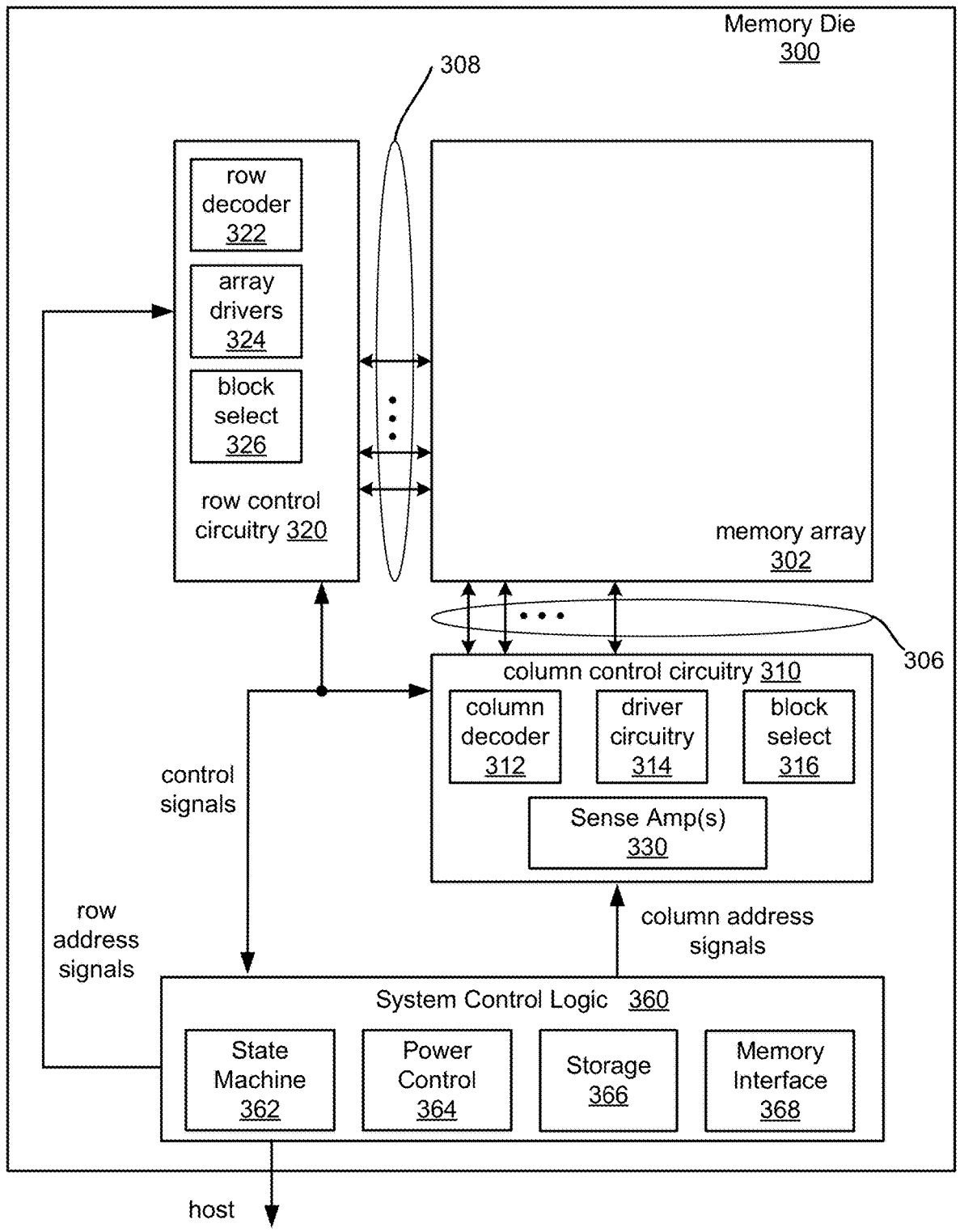
FIG. 3A is a functional block diagram of an embodiment of a memory die.

FIG. 3A is a block diagram that depicts one example of a memory die 300 that can implement the technology described herein. Memory die 300, which can correspond to one of the memory die 300 of FIG. 2B, includes a memory array 302 that can include any of memory cells described in the following. The array terminal lines of memory array 302 include the various layer(s) of word lines organized as rows, and the various layer(s) of bit lines organized as columns. However, other orientations can also be implemented. Memory die 300 includes row control circuitry 320, whose outputs are connected to respective word lines of the memory array 302 via electrical paths 308. Row control circuitry 320 receives a group of M row address signals and one or more various control signals from System Control Logic circuit 360, and typically may include such circuits as row decoders 322, array terminal drivers 324, and block select circuitry 326 for both reading and writing operations. Row control circuitry 320 may also include read/write circuitry. Memory die 300 also includes column control circuitry 310 including sense amplifier(s) 330 whose input/outputs are connected to respective bit lines of the memory array 302. Although only single block is shown for memory structure 302, a memory die can include multiple arrays that can be individually accessed. Column control circuitry 310 receives a group of N column address signals and one or more various control signals from System Control Logic 360, and typically may include such circuits as column decoders 312, array terminal receivers or drivers 314, block select circuitry 316, as well as read/write circuitry, and I/O multiplexers.

System control logic 360 receives data and commands from a host and provides output data and status to the host. In other embodiments, system control logic 360 receives data and commands from a separate controller circuit and provides output data to that controller circuit, with the controller circuit communicating with the host. In some embodiments, the system control logic 360 can include a state machine 362 that provides die-level control of memory operations. In one embodiment, the state machine 362 is programmable by software. In other embodiments, the state machine 362 does not use software and is completely implemented in hardware (e.g., electrical circuits). In another embodiment, the state machine 362 is replaced by a micro-controller or microprocessor, either on or off the memory chip. The system control logic 360 can also include a power control module 364 controls the power and voltages supplied to the rows and columns of the memory structure 302 during memory operations and may include charge pumps and regulator circuit for creating regulating voltages. System control logic 360 includes storage 366, which may be used to store parameters for operating the memory array 302.

Commands and data are transferred between the controller 102 and the memory die 300 via memory controller interface 368 (also referred to as a "communication interface"). Memory controller interface 368 is an electrical interface for communicating with memory controller 102. Examples of memory controller interface 368 include a Toggle Mode Interface and an Open NAND Flash Interface (ONFI). Other I/O interfaces can also be used. For example, memory controller interface 368 may implement a Toggle Mode Interface that connects to the Toggle Mode interfaces of memory interface 228/258 for memory controller 102. In one embodiment, memory controller interface 368 includes a set of input and/or output (I/O) pins that connect to the controller 102.

In some embodiments, all of the elements of memory die 300, including the system control logic 360, can be formed as part of a single die. In other embodiments, some or all of the system control logic 360 can be formed on a different die.

For purposes of this document, the phrase "control circuit(s)" can include a controller, a state machine, a micro-controller, micro-processor, and/or other control circuitry as represented by the system control logic 360, column control circuitry 310 or other analogous circuits that are used to control non-volatile memory.

In one embodiment, memory structure 302 comprises a three dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping.

In another embodiment, memory structure 302 comprises a two dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 302 is not limited to the examples above. Many different types of memory array architectures or memory technologies can be used to form memory structure 302. No particular non-volatile memory technology is required for purposes of the new claimed embodiments proposed herein. Other examples of suitable technologies for memory cells of the memory structure 302 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 302 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 3A can be grouped into two parts, the structure of memory structure 302 of the memory cells and the peripheral circuitry, including all of the other elements. An important characteristic of a memory circuit is its capacity, which can be increased by increasing the area of the memory die of storage system 100 that is given over to the memory structure 302; however, this reduces the area of the memory die available for the peripheral circuitry. This can place quite severe restrictions on these peripheral elements. For example, the need to fit sense amplifier circuits and latches within the available area can be a significant restriction on sense amplifier and latch design architectures. With respect to the system control logic 360, reduced availability of area can limit the available functionalities that can be implemented on-chip. Consequently, a basic trade-off in the design of a memory die for the storage system 100 is the amount of area to devote to the memory structure 302 and the amount of area to devote to the peripheral circuitry.

Another area in which the memory structure 302 and the peripheral circuitry are often at odds is in the processing involved in forming these regions, since these regions often involve differing processing technologies and the trade-off in having differing technologies on a single die. For example, when the memory structure 302 is NAND flash, this is an NMOS structure, while the peripheral circuitry is often CMOS based. For example, elements such sense amplifier circuits, charge pumps, logic elements in a state machine, and other peripheral circuitry in system control logic 360 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 3A onto separately formed dies that are then bonded together. More specifically, the memory structure 302 can be formed on one die and some or all of the peripheral circuitry elements, including one or more control circuits, can be formed on a separate die. For example, a memory die can be formed of just the memory elements, such as the array of memory cells of flash NAND memory, MRAM memory, PCM memory, ReRAM memory, or other memory type. Some or all of the peripheral circuitry, even including elements such as decoders, latches, and sense amplifiers, can then be moved on to a separate die. This allows each of the memory die to be optimized individually according to its technology. For example, a NAND memory die can be optimized for an NMOS based memory array structure, without worrying about the CMOS elements that have now been moved onto a separate peripheral circuitry die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other memory circuit. Although the following will focus on a bonded memory circuit of one memory die and one peripheral circuitry die, other embodiments can use more die, such as two memory die and one peripheral circuitry die, for example.

Figure 3B:
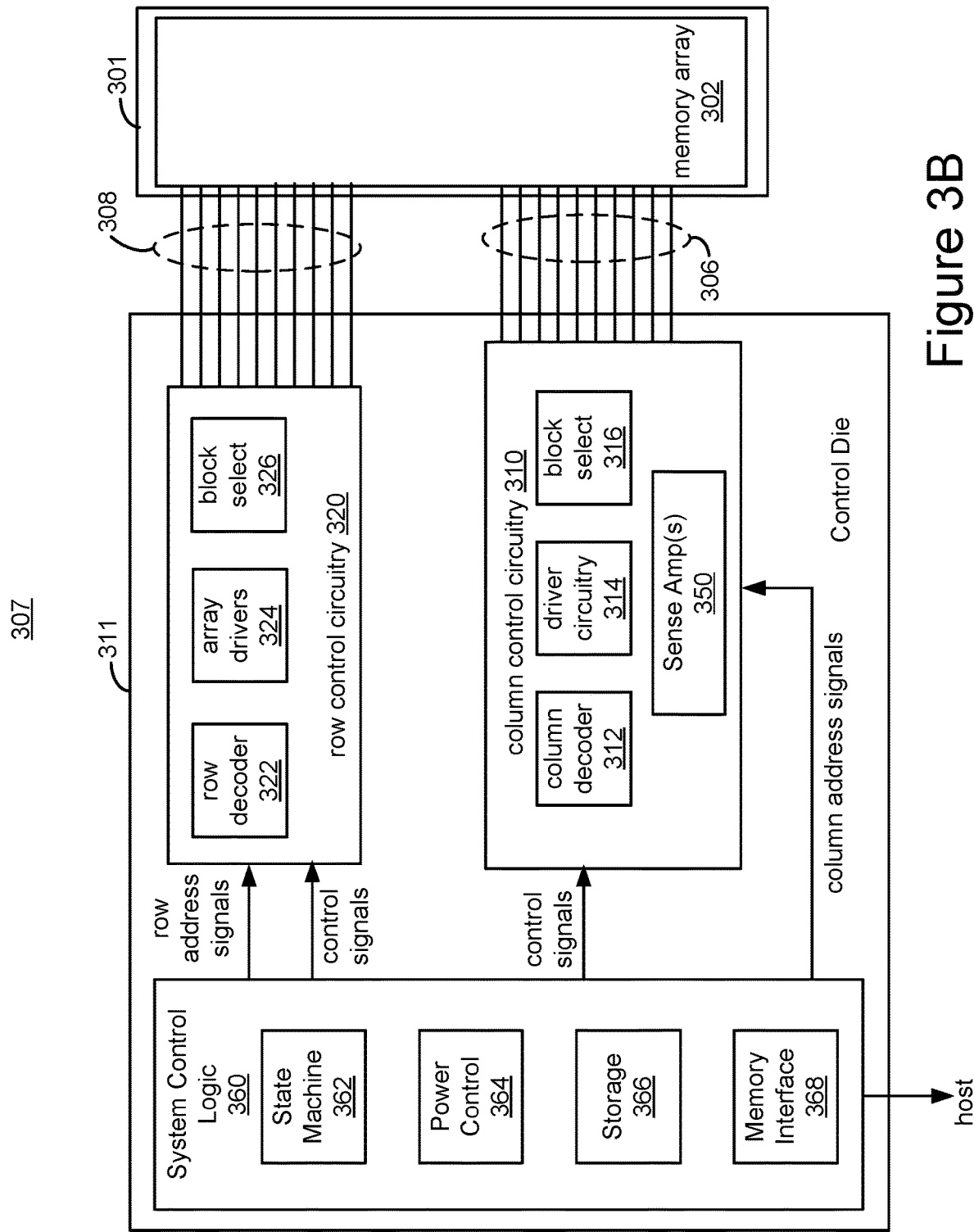
FIG. 3B is a functional block diagram of an embodiment of an integrated memory assembly.

FIG. 3B shows an alternative arrangement to that of FIG. 3A which may be implemented using wafer-to-wafer bonding to provide a bonded die pair. FIG. 3B depicts a functional block diagram of one embodiment of an integrated memory assembly 307. The integrated memory assembly 307 may be used in a memory package 104 in storage system 100. The integrated memory assembly 307 includes two types of semiconductor die (or more succinctly, "die"). Memory structure die 301 includes memory structure 302. Memory structure 302 may contain non-volatile memory cells. Control die 311 includes control circuitry 360, 310, 320. In some embodiments, the control die 311 is configured to connect to the memory structure 302 in the memory structure die 301. In some embodiments, the memory structure die 301 and the control die 311 are bonded together.

FIG. 3B shows an example of the peripheral circuitry, including control circuits, formed in a peripheral circuit or control die 311 coupled to memory structure 302 formed in memory structure die 301. Common components are labelled similarly to FIG. 3A. It can be seen that system control logic 360, row control circuitry 320, and column control circuitry 310 are located in control die 311. In some embodiments, all or a portion of the column control circuitry 310 and all or a portion of the row control circuitry 320 are located on the memory structure die 301. In some embodiments, some of the circuitry in the system control logic 360 is located on the on the memory structure die 301.

System control logic 360, row control circuitry 320, and column control circuitry 310 may be formed by a common process (e.g., CMOS process), so that adding elements and functionalities, such as ECC, more typically found on a memory controller 102 may require few or no additional process steps (i.e., the same process steps used to fabricate controller 102 may also be used to fabricate system control logic 360, row control circuitry 320, and column control circuitry 310). Thus, while moving such circuits from a die such as memory structure die 301 may reduce the number of steps needed to fabricate such a die, adding such circuits to a die such as control die 311 may not require any additional process steps. The control die 311 could also be referred to as a CMOS die, due to the use of CMOS technology to implement some or all of control circuitry 360, 310, 320.

FIG. 3B shows column control circuitry 310 including sense amplifier(s) 350 on the control die 311 coupled to memory structure 302 on the memory structure die 301 through electrical paths 306. For example, electrical paths 306 may provide electrical connection between column decoder 312, driver 314, and block select circuitry 316 and bit lines of memory structure 302. Electrical paths may extend from column control circuitry 310 in control die 311 through pads on control die 311 that are bonded to corresponding pads of the memory structure die 301, which are connected to bit lines of memory structure 302. Each bit line of memory structure 302 may have a corresponding electrical path in electrical paths 306, including a pair of bond pads, which connects to column control circuitry 310. Similarly, row control circuitry 320, including row decoder 322, array drivers 324, and block select circuitry 326 are coupled to memory structure 302 through electrical paths 308. Each of electrical path 308 may correspond to a word line, dummy word line, or select gate line. Additional electrical paths may also be provided between control die 311 and memory structure die 301.

For purposes of this document, the phrase "control circuit(s)" can include one or more of controller 102, system control logic 360, column control circuitry 310, row control circuitry 320, a micro-controller, a state machine, and/or other control circuitry, or other analogous circuits that are used to control non-volatile memory. The one or more control circuits can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

Figure 4A:
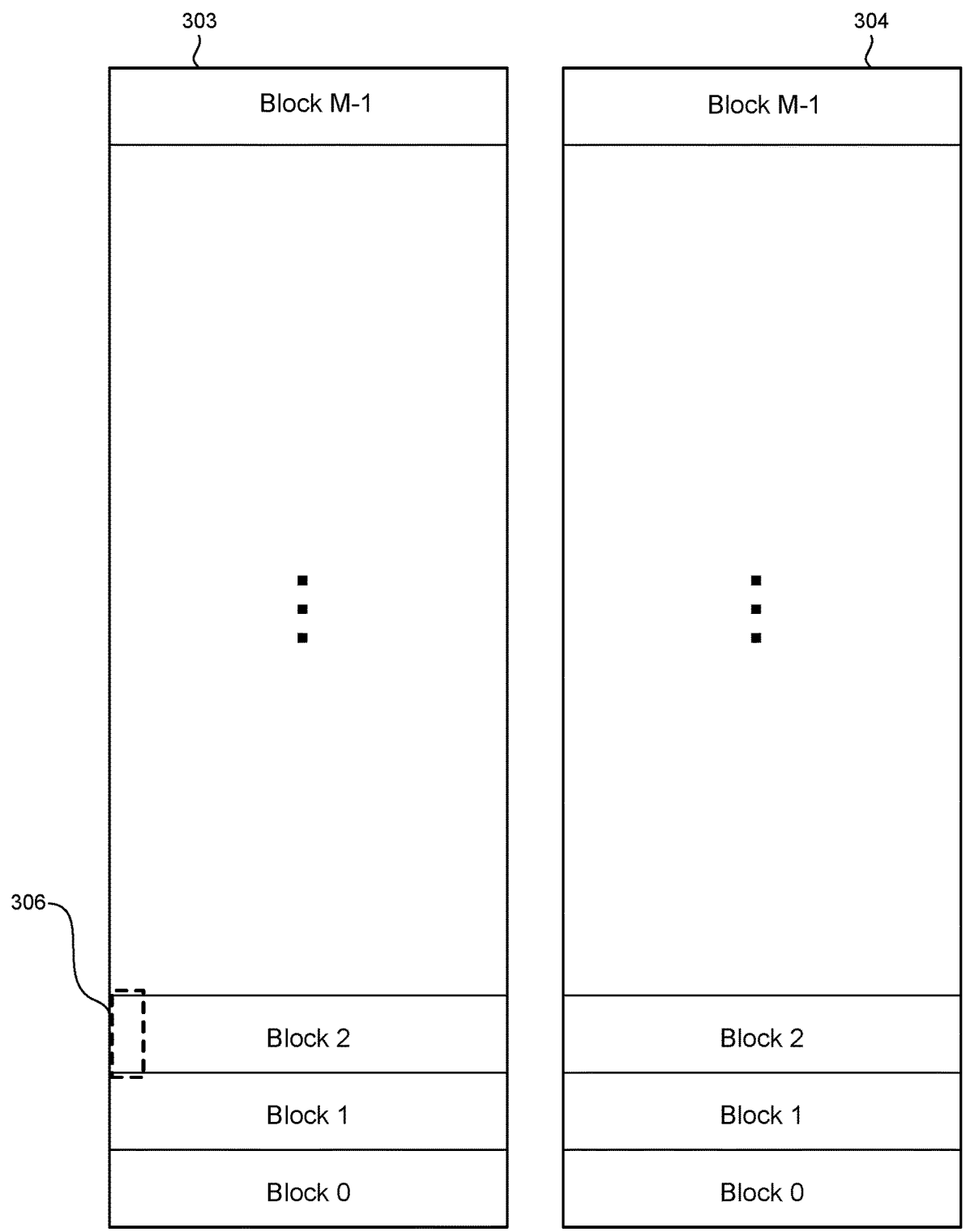
FIG. 4A is a block diagram of a memory structure that includes two planes.

FIG. 4A is a block diagram explaining one example organization of a memory array (e.g., memory array 302), which is divided into two planes 303 and 304. Each plane is then divided into M blocks. In one example, each plane has about 2000 blocks. However, different numbers of blocks and planes can also be used. In one embodiment, a block of memory cells is a unit of erase. That is, all memory cells of a block are erased together. In other embodiments, memory cells can be grouped into blocks for other reasons, such as to organize the memory array 302 to enable the signaling and selection circuits. In some embodiments, a block represents a groups of connected memory cells as the memory cells of a block share a common set of word lines. Blocks of a plane may be connected by a common set of bit lines and may share certain access circuits (e.g., sense amplifiers and/or latches) connected to bit lines. Within a plane, a selected block may be connected to access circuits to allow access to non-volatile memory cells (e.g., for programming or reading).

Figure 4B:
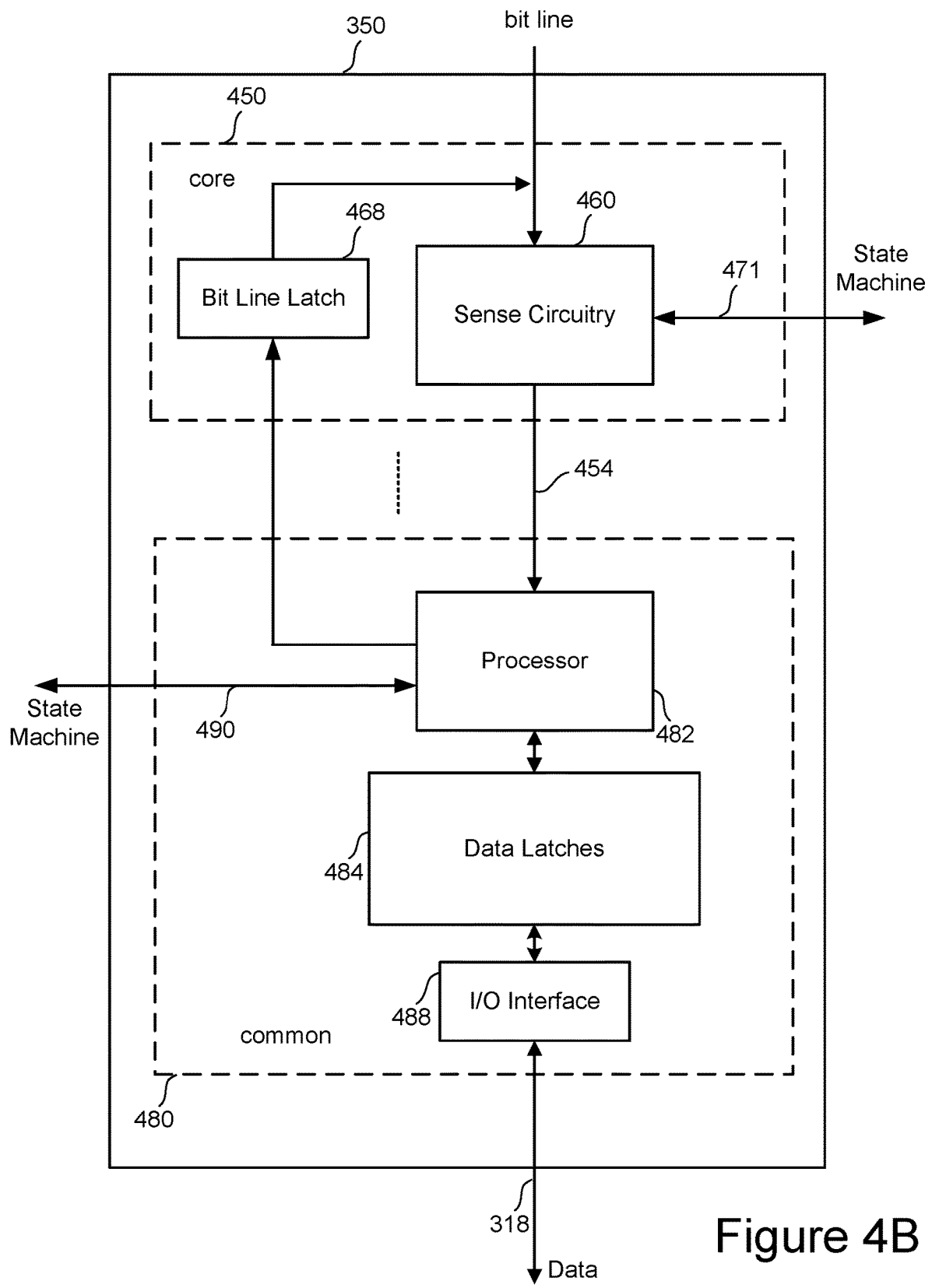
FIG. 4B is a block diagram of an individual sense block partitioned into a core portion and a common portion.

FIG. 4B is a block diagram of an individual sense block of sense amplifiers 330 or 350 partitioned into a core portion, referred to as a sense module 450, and a common portion 480. In one embodiment, there will be a separate sense module 450 for each bit line and one common portion 480 for a set of multiple sense modules 450. In one example, a sense block will include one common portion 480 and eight, twelve, or sixteen sense modules 450. Each of the sense modules in a group will communicate with the associated common portion via a data bus 454.

Sense module 450 comprises sense circuitry 460 that determines whether a conduction current in a connected bit line is above or below a predetermined level or, in voltage based sensing, whether a voltage level in a connected bit line is above or below a predetermined level. The sense circuitry 460 is configured to receive control signals from the state machine via input lines 471. In some embodiments, sense module 450 includes a circuit commonly referred to as a sense amplifier. Sense module 450 also includes a bit line latch 468 that is used to set a voltage condition on the connected bit line. For example, a predetermined state latched in bit line latch 468 will result in the connected bit line being pulled to a state designating program inhibit (e.g., Vdd).

Common portion 480 comprises a processor 482, a set of data latches 484 and an I/O Interface 488 coupled between the set of data latches 484 and data bus 318. Processor 482 performs computations. For example, one of its functions is to determine the data stored in the sensed memory cell and store the determined data in the set of data latches. The set of data latches 484 is used to store data bits determined by processor 482 during a read operation. It is also used to store data bits imported from the data bus 318 during a program operation. The imported data bits represent write data meant to be programmed into the memory. I/O Interface 488 provides an interface between data latches 484 and the data bus 318.

During read or sensing, the operation of the system is under the control of state machine 362 that controls the supply of different control gate or other bias voltages to the addressed memory cell(s). As it steps through the various predefined control gate voltages corresponding to the various memory states supported by the memory, the sense module 450 may trip at one of these voltages and an output will be provided from sense module 450 to processor 482 via data bus 454. At that point, processor 482 determines the resultant memory state by consideration of the tripping event(s) of the sense module and the information about the applied control gate voltage from the state machine via input lines 490. It then computes a binary encoding for the memory state and stores the resultant data bits into data latches 484. In another embodiment of the core portion, bit line latch 468 serves double duty, both as a latch for latching the output of the sense module 450 and also as a bit line latch as described above.

Data latches 484 contains a stack of data latches (data latch stack) corresponding to the sense module. In one embodiment, data latches 484 includes three, four, eight, sixteen or another number of data latches. In one embodiment, the latches are each one bit.

During program, the data to be programmed is stored in the set of data latches 484 from the data bus 318. During the program-verify process, Processor 482 monitors the verified memory state relative to the desired memory state. When the two are in agreement, processor 482 sets the bit line latch 468 so as to cause the bit line to be pulled to a state designating program inhibit. This inhibits the memory cell coupled to the bit line from further programming even if it is subjected to programming pulses on its control gate. In other embodiments the processor initially loads the bit line latch 468 and the sense circuitry sets it to an inhibit value during the verify process.

In some implementations (but not required), the data latches are implemented as a shift register so that the parallel data stored therein is converted to serial data for data bus 318, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 5:
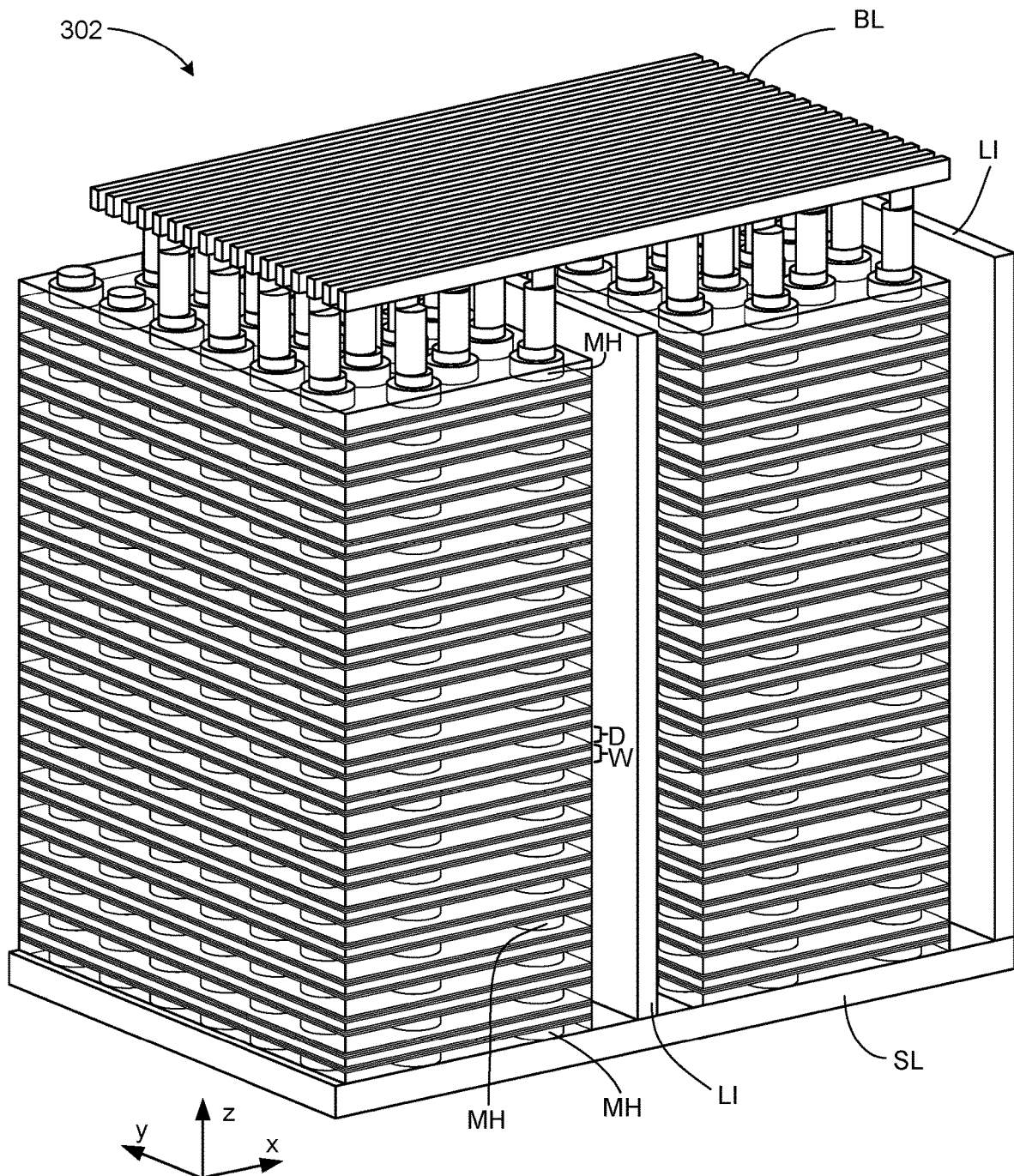
FIG. 5 is a perspective view of a portion of one example embodiment of a monolithic three dimensional memory array that can comprise memory structure.

FIG. 5 is a perspective view of a portion of one example embodiment of a monolithic three dimensional (3D) memory array that can comprise memory structure 302, which includes a plurality non-volatile memory cells. For example, FIG. 5 shows a portion of one block comprising memory. The structure depicted includes a set of bit lines BL (extending along the x-direction and separated in the y-direction) positioned above a stack of alternating dielectric layers and conductive layers with vertical columns of materials extending (in the z-direction) through the dielectric layers and conductive layers. For example purposes, one of the dielectric layers is marked as D and one of the conductive layers (also called word line layers) is marked as W. The word line layers contain one or more word lines that are connected to memory cells. For example, a word line may be connected to a control gate of a memory cell. The number of alternating dielectric layers and conductive layers can vary based on specific implementation requirements. One set of embodiments includes between 108-304 alternating dielectric layers and conductive layers. One example embodiment includes 96 data word line layers, 8 select layers, 6 dummy word line layers and 110 dielectric layers. More or fewer than 108-304 layers can also be used. The alternating dielectric layers and conductive layers are divided into four "fingers" or sub-blocks by local interconnects LI, in an embodiment. FIG. 5 shows two fingers and two local interconnects LI. Below the alternating dielectric layers and word line layers is a source line layer SL. Vertical columns of materials (also known as memory holes) are formed in the stack of alternating dielectric layers and conductive layers. For example, one of the vertical columns/memory holes is marked as MR. Note that in FIG. 5, the dielectric layers are depicted as see-through so that the reader can see the memory holes positioned in the stack of alternating dielectric layers and conductive layers. In one embodiment, NAND strings are formed by filling the vertical column/memory hole with materials including a charge-trapping material to create a vertical column of memory cells. Each memory cell can store one or more bits of data.

Figure 6:
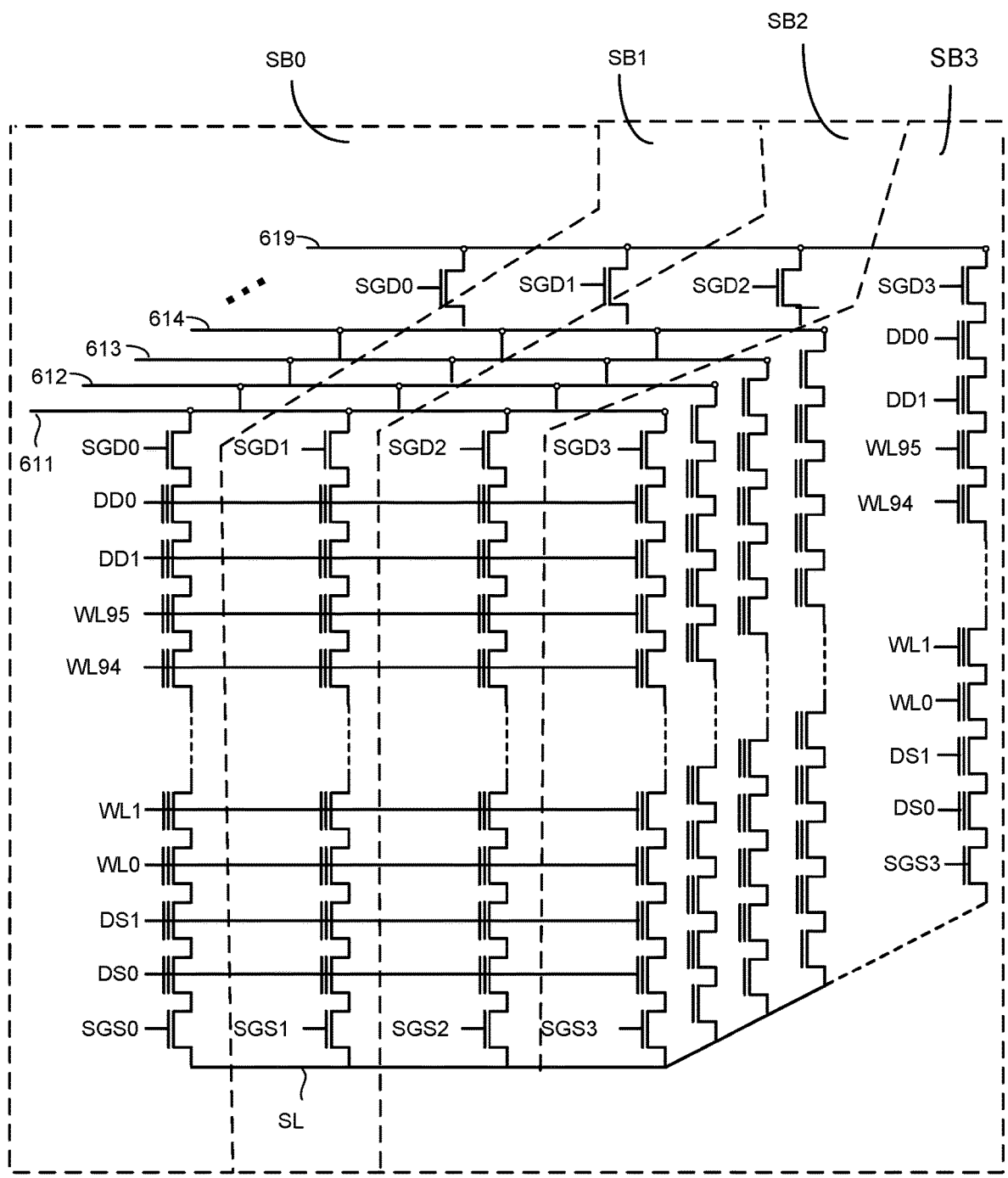
FIG. 6 is a schematic of a plurality of NAND strings.

FIG. 6 is a schematic diagram of a portion of the memory depicted in in FIG. 5. FIG. 6 shows physical word lines WLL0-WLL95 running across the entire block. The structure of FIG. 6 corresponds to portion 606 in Block 2 of FIGS. 5-6E, including bit lines 611, 612, 613, 614, . . . , 619. Within the block, each bit line is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Although the example memory system of FIGS. 5-6 is a three dimensional memory structure that includes vertical NAND strings with charge-trapping material, other (2D and 3D) memory structures (e.g., MRAM, ReRAM, PCM) can also be used with the technology described herein.

FIG. 7A is a graph of threshold voltage versus number of memory cells and illustrates example threshold voltage distributions for the memory array when each memory cell stores one bit of data. FIG. 7A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." Memory cells that store one bit of data are referred to as single level cells ("SLC").

FIG. 7B is a graph of threshold voltage versus number of memory cells and illustrates example threshold voltage distributions for the memory array when each memory cell stores three bits of data in what may be referred to as a Tri-Level Cell ("TLC"). Other embodiments, however, may use other data capacities per memory cell (e.g., such as one, two, four, or five bits of data per memory cell). Memory cells that store more than one bit of data may be referred to as multi-level cells ("MLC"). FIG. 7B shows eight threshold voltage distributions, corresponding to eight data states. For a data state N, that data state N has higher threshold voltages than data state N−1 and lower threshold voltages than data state N+1. The first threshold voltage distribution (data state) S0 represents memory cells that are erased. The other seven threshold voltage distributions (data states) S1-S7 represent memory cells that are programmed and, therefore, are also called programmed data states. In some embodiments, data states S1-S7 can overlap, with error correction used to identify the correct data being stored.

FIG. 7B shows seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in. In FIG. 7A, read reference voltage Vr is used to test whether memory cells are erased or programmed.

FIG. 7B also shows seven verify reference voltages, Vv1, Vv2, Vv3, Vv4, Vv5, Vv6, and Vv7 (also referred to as verify target voltages). When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S I-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 7B represent the full sequence programming. The technology described herein can also be used with other types of programming in addition to full sequence programming including (but not limited to) multiple stage/phase programming.

Each threshold voltage distribution (data state) of FIG. 7B corresponds to predetermined values for the set of data bits stored in the memory cells. The specific relationship between the data programmed into the memory cell and the threshold voltage levels of the memory cell depends upon the data encoding scheme adopted for the memory cells. In one embodiment, data values are assigned to the threshold voltage ranges using a Gray code assignment so that if the threshold voltage of a memory erroneously shifts to its neighboring physical state, only one bit will be affected.

FIG. 7C is a table describing one example of an assignment of data values to data states. In the table of FIG. 7B, S0=111 (erased state), S1=110, S2=100, S3=000, S4=010, S5=011, S6=001 and S7=101. Other encodings of data can also be used. No particular data encoding is required by the technology disclosed herein. In one embodiment, when a block is subjected to an erase operation, all memory cells are moved to data state S0, the erased state.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 6) or verify operation (e.g. see verify reference voltages Vv1, Vv2, Vv3, Vv4, Vv5, Vv6, and Vv7 of FIG. 6) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figures 8A, 8B:
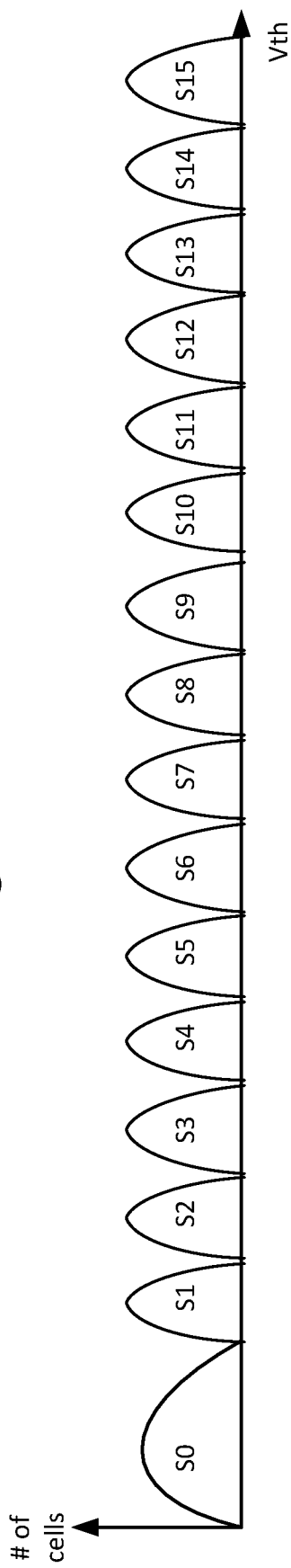
FIG. 8A shows threshold voltage distributions of memory cells in a Quad-Level Cell (QLC) embodiment.
FIG. 8B is a table describing one example of an assignment of data values to data states for a QLC embodiment.

FIGS. 8A-B illustrate an example of a non-volatile memory that uses sixteen data states to store four bits per cell in what may be referred to as a Quad Level Cell ("QLC") memory. FIG. 8A is a graph of threshold voltage versus number of memory cells. Data state S0 represents memory cells that are erased. The other fifteen threshold voltage distributions (data states) S1-S15 represent memory cells that are programmed and, therefore, are also called programmed data states. In some embodiments, data states S1-S15 can overlap, with error correction used to identify the correct data being stored. Read and read verify voltages are not shown in FIG. 8A and may be implemented similarly to the previous example.

FIG. 8B is a table describing one example of an assignment of data values to data states. Other encodings of data can also be used. No particular data encoding is required by the technology disclosed herein. In one embodiment, when a block is subjected to an erase operation, all memory cells are moved to data state S0, the erased state. Subsequently, during programming, individual memory cells may be programmed to data states according to the data values to be stored.

While the examples illustrated in FIGS. 7A-8B refer to specific assignment schemes to store particular numbers of bits per cell, the present technology is not limited to such examples and may be applied to memories storing any number of bits per cell using any assignment scheme.

In order to program and read data to and from non-volatile memory cells, a number of data latches may be provided (e.g., data latches 484 coupled to sense circuitry 460 in sense amplifier block 350). The number and configuration of such data latches may be adapted to the non-volatile memory cells to which they are connected (e.g., the number of bits to be stored per cell).

FIG. 9 shows an example of data latches (e.g., data latches 484) for two planes (plane X and plane Y) of a non-volatile memory structure. Each plane has a similar data latch configuration. For example, in plane X, a set (row) of Sense Data Latches (SDL) may be configured to receive sensed bits from a sense amplifier, with additional sets of data latches ADL, BDL, CDL and TDL, each configured to store data and to transfer data to and from a set of transfer data latches, XDL 900. Transfer data latch, XDL 900, may also be referred to as a "cache buffer" in some cases and data latches ADL, BDL, CDL, TDL and SDL may be referred to as internal latches. In some examples, such internal data latches are limited to data transfer to other internal latches and to XDL, whereas XDL may be configured for external data transfer via bus 906 (e.g., to IO pads 902, which may connect to other components such as a memory controller). Each row of data latches is configured to store 16 KB of data in this example (in other examples, rows of data latches may be configured to store other amounts of data).

FIG. 9 shows plane Y having the same sets of data latches as in plane X in a mirror-image of the arrangement of plane X (with XDL 904 at the top, then ADL, BDL, CDL, TDL and SDL at the bottom). In this arrangement, each plane has a dedicated set of transfer data latches (e.g., XDL 900 in plane X and XDL 904 in plane Y). Both XDL 900 and XDL 904 are connected to IO pads 902 by bus 906, which allows data to be transferred from IO pads 902 to XDL 900 and XDL 904 (e.g., for writing to non-volatile memory cells of planes X and Y respectively) and to be transferred from XDL 900 and XDL 904 to IO pads 902 (e.g., for reading from non-volatile memory cells of planes X and Y respectively). In some examples, XDL 900 and XDL 904 may operate substantially in parallel (e.g., transferring data to or from internal data latches in parallel during reading or writing operations).

In contrast with the arrangement of FIG. 9, FIG. 10 shows an alternative arrangement that uses a shared set of transfer data latches, shared XDL 1010. According to examples of the present technology, a shared XDL 1010 may be configured for transfer of data with a first plurality of data latches of a first plane (e.g., plane X) and a second plurality of data latches of a second plane (e.g., plane Y). Data from IO pads 902 may be transferred to shared transfer data latch 1010 prior to being transferred to internal data latches (e.g., ADL, BDL, CDL, TDL and SDL) of either plane X and plane Y. Shared XDL 1010 may be considered a means for latching data for transfer to and from a first plurality of data latches of plane X and a second plurality of data latches of plane Y.

FIG. 10 shows Dynamic Data Latches (DLs) 1012 and 1014 in planes X and Y respectively. Dynamic DLs 1012, 1014 may be connected to shared XDL 1010 to transfer data to and from shared XDL 1010 and internal DLs of planes X and Y respectively. While other data latches shown, including ADL, BDL, CDL, TDL, SDL and XDL data latches may be non-volatile data latches that retain data without need of periodic refresh operations, Dynamic DLs 1012, 1014 may be volatile data latches that can only hold data for a relatively short period of time without a refresh operation (e.g., data may become corrupted if it is held for longer than a predetermined period of time without a refresh operation). In an example, Dynamic DLs 1012, 1014 are formed by circuits that occupy less space than those of other data latches (e.g., circuits that form non-volatile data latches ADL, BDL, CDL, TDL, SDL and XDL). In an example, the combination of shared XDL 1010 and Dynamic DLs 1012, 1014 may be smaller than two XDLs (e.g., smaller than XDL 900 and XDL 904 of FIG. 9) so that the area occupied by the latches shown may be reduced from the example of FIG. 9 to that of FIG. 10. Dynamic DL 1012 may be considered a first means for volatile storage of data, the first means for volatile storage of data connected to a first plurality of data latches (e.g., internal DLs of plane X) and Dynamic DL 1014 may be considered a second means for volatile storage of data, the second means for volatile storage of data connected to a second plurality of data latches (e.g., internal DLs of plane Y).

Figure 11:
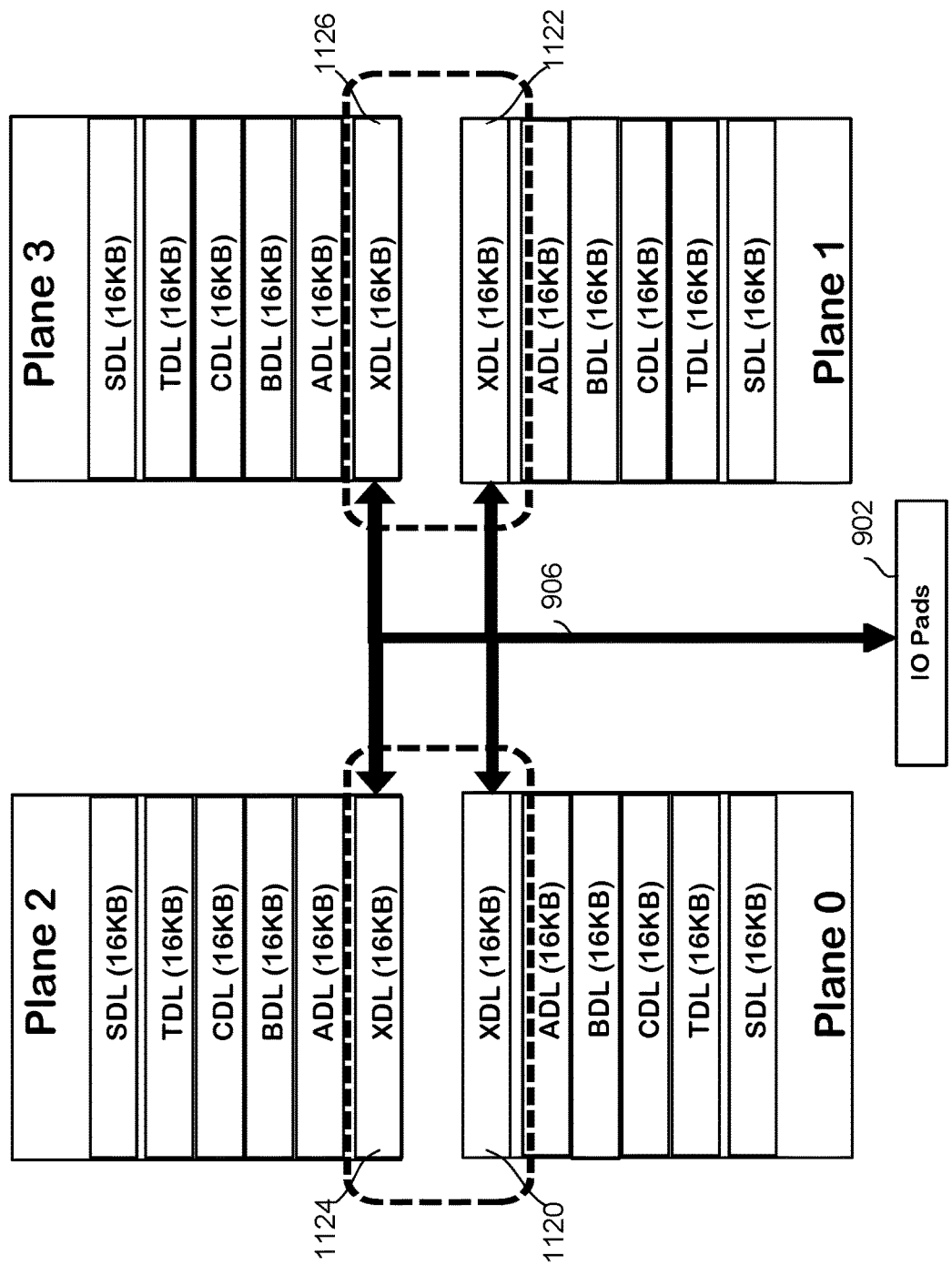
FIG. 11 shows an example of four planes connected to a bus, with each plane having a dedicated set of data transfer latches.

FIG. 11 shows an example that includes dedicated sets of XDLs for each plane of a four-plane arrangement. XDL 1120 is dedicated to plane 0, XDL 1122 is dedicated to plane 1, XDL 1124 is dedicated to plane 2 and XDL 1126 is dedicated to plane 3. Bus 906 connects XDLs 1120, 1122, 1124 and 1126 to IO pads 902, which may connect to other components (e.g., to a memory controller). While data may be transferred sequentially over bus 906, XDLs 1120, 1122, 1124 and 1126 may operate in parallel for some operations (e.g., transfer of data to and from internal data latches) as in the example of FIG. 9.

Figure 12:
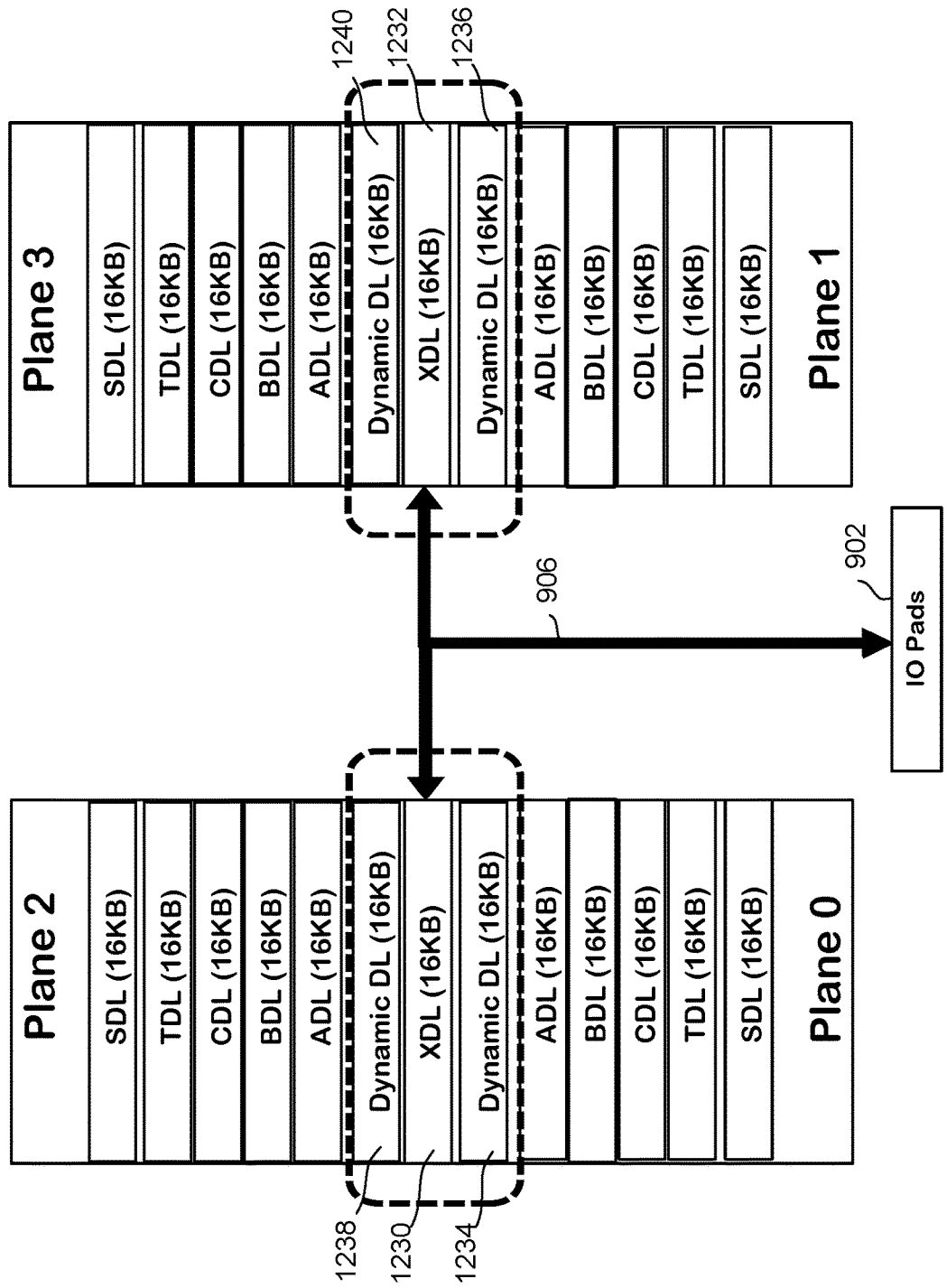
FIG. 12 shows an example of four planes connected to a bus, with pairs of planes sharing a common set of data transfer latches.

FIG. 12 shows an alternative four-plane arrangement to that of FIG. 11. Instead of a dedicated XDL for each plane, FIG. 12 shows shared XDL 1230, which is shared by plane 0 and plane 2 and shared XDL 1232, which is shared by plane 1 and plane 3. Shared XDL 1230 and 1232 may be considered means for latching data for transfer to and from a first plurality of data latches of a first plane (e.g., plane 0 and plane 1 respectively) and a second plurality of data latches of a second plane (e.g., plane 2 and plane 3 respectively). FIG. 12 also shows Dynamic DL 1234 in plane 0, Dynamic DL 1236 in plane 1, Dynamic DL 1238 in plane 2 and Dynamic DL 1240 in plane 3. Dynamic DLs 1234, 1236, 1238 and 1240 may be similar to Dynamic DLs 1012, 1014 (e.g., may be volatile data latches formed by circuits that occupy less space than those of other data latches, ADL, BDL, CDL, TDL, SDL and XDL). Thus, the latches shown in FIG. 12 may occupy less area on a die than the latches shown in FIG. 11.

While the examples of FIGS. 10 and 12 include Dynamic DLs in addition to the shared XDLs, in some cases shared XDLs may be used without Dynamic DLs. Dynamic DLs may provide an additional set of latches in each plane to facilitate certain operations in certain memories. However, in some memories, sufficient latches may be available without Dynamic DLs.

FIGS. 13A-B illustrate how various data latches ("Design Latches") may be used in different configurations. FIG. 13A illustrates how the latches of the previous examples may be used in a QLC memory (storing four bits per cell using a 16 data states code). The Design Latches, including Dynamic DLs, are shown in the first column. An example of usage of the latches in a dedicated XDL arrangement (e.g., as shown in FIGS. 9 and 11) is shown in the second column. In this example, XDL, ADL, BDL and CDL are used to store the 16 states codes (four bits, e.g., as illustrated in FIG. 8B) of data (e.g., data to be written or read), a Dynamic DL is not used (indicated by "X"), TDL is used for quick pass write ("QPW") and SDL is used for sensing and/or bit line control. An example of usage of the latches in a shared (common) XDL architecture (e.g., as shown in FIGS. 10 and 12) is shown in the third column. In this example, XDL is shared between planes and is not used to store the 16 state codes for either plane and instead is used for user access (e.g., transfer of data to/from a user such as a memory controller). The 16 state codes are stored in ADL, BDL, CDL and the Dynamic DL for the respective plane. TDL is used for quick pass write and SDL is used for sensing and/or bit line control as before. Thus, it can be seen that providing a Dynamic DL in each plane facilitates operation of QLC memory when a dedicated XDL is unavailable for each plane (e.g., where XDL is common to multiple planes).

FIG. 13B shows how latches may be used in a TLC memory (storing three bits per cell using an 8 data states code). The Design Latches, including Dynamic DLs, are shown in the first column. An example of usage of the latches in a dedicated XDL arrangement (e.g., as shown in FIGS. 9 and 11) is shown in the second column. In this example, XDL is used as a user cache (e.g., used by a memory controller as a cache) and ADL, BDL and CDL are used to store the 8 states codes (three bits, e.g., as illustrated in FIG. 7C) of data (e.g., data to be written or read). A Dynamic DL is not used (indicated by "X"), TDL is used for quick pass write ("QPW") and SDL is used for sensing and/or bit line control. An example of usage of the latches in a shared (common) XDL architecture (e.g., as shown in FIGS. 10 and 12) is shown in the third column. In this example, XDL is shared between planes and is not used as a user cache and instead is used for user access (e.g., transfer of data to/from a user such as a memory controller). The 8 states code is stored in ADL, BDL and CDL for the respective plane. TDL is used for quick pass write and SDL is used for sensing and/or bit line control as before. A Dynamic DL is optional in this arrangement.

Latch circuits in any of the above examples may be implemented in various ways. For example, individual internal data latches may be connected by a local data bus in each plane and may be selectively connected to a shared XDL. FIG. 14 illustrates an example of a shared XDL 1450 that is shared between plane 1452 and plane 1454 (e.g., between plane X and plane Y of FIG. 9 or plane 0 and plane 2 of FIG. 12). Each plane includes a sense amplifier ("SA") that may be connectable to a bit line to sense data from memory cells along the bit line. Each plane includes internal latches ADL, BDL, CDL, TDL, SDL and a Dynamic DL ("DynDL") that are connected by a local bus (local bus 1456 of plane 1452 and local bus 1458 of plane 1454). Shared XDL 1450 may be coupled to local busses 1456 and 1458 (e.g., through switches, which may be formed by transistors) so that data may be transferred between shared XDL 1450 and local busses 1456 and 1458. Shared XDL 1450 is also connected to a data transfer bus ("XBUS"), which may allow transfer to and from other components (e.g., bus 906 connecting to IO pads 902). Individual latches may be implemented by respective circuits in various ways. A large number of data latch stacks such as illustrated in FIG. 14A may form rows of data latches (e.g., rows of SDLs, TDLs, ADLs, BDLs, CDLs and DynDLs) in each plane.

Figure 14B:
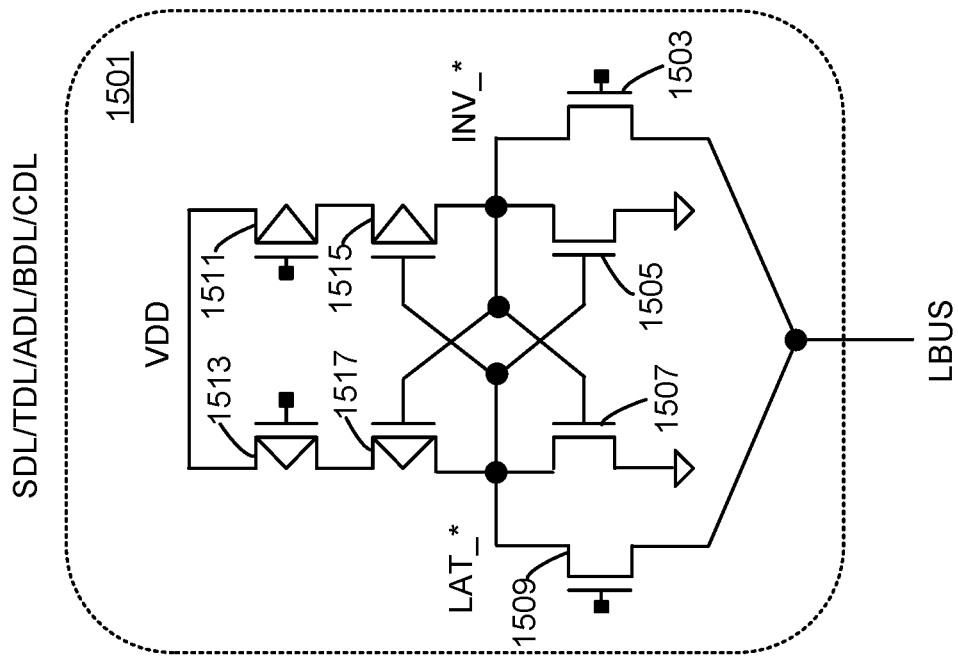
FIGS. 14A-D illustrate examples of implementation of latches in non-volatile memory systems.
Figure 14A:
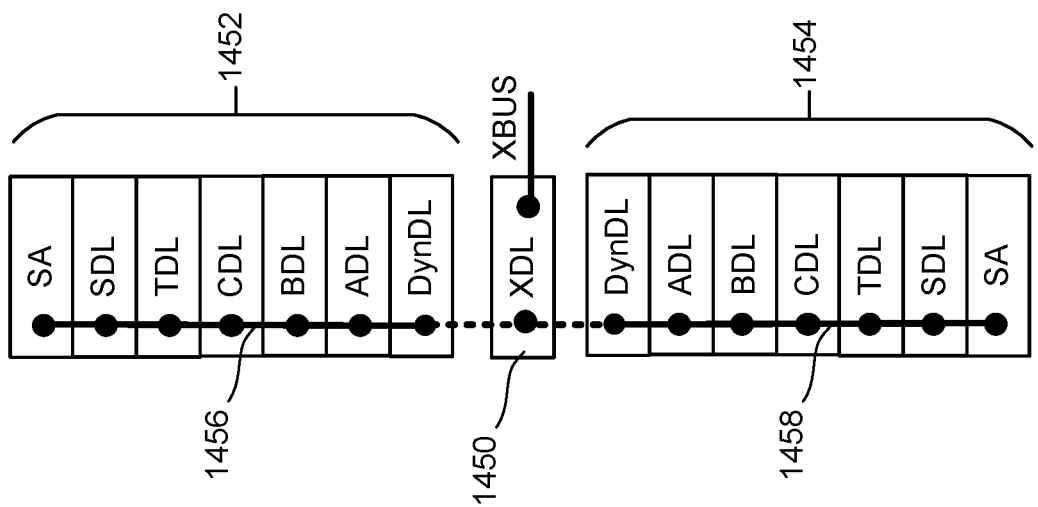
Figure 14D:
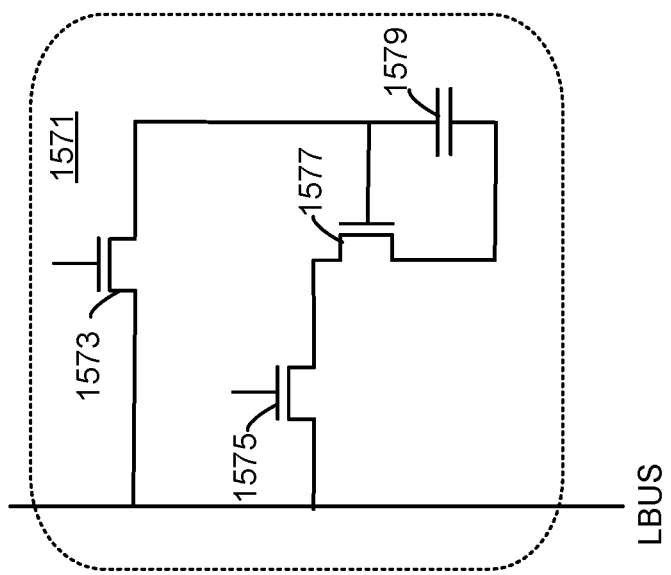
Figure 14C:
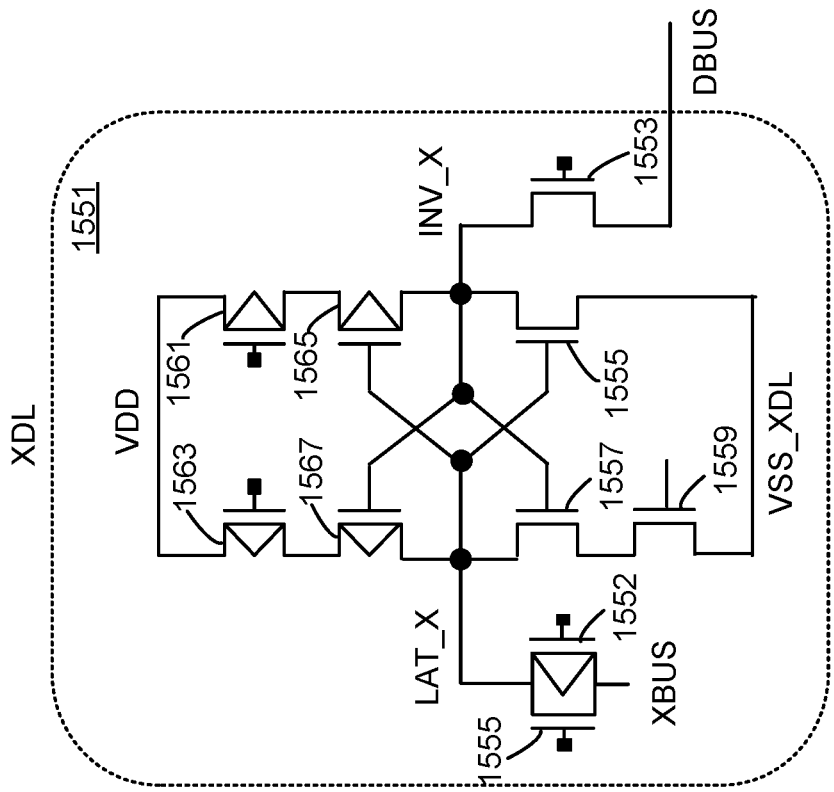

FIGS. 14B and 14C respectively illustrate an embodiment for local latches connected along the local data bus (e.g., local data bus 1456, 1458) and an embodiment for the transfer data latches. Each of the latches SDL, TDL, ADL, BDL, and CDL can use the structure of latch 1501 that has a left leg with the node LAT_* that can hold the latched value and a right leg with a node INV_* that can hold the inverse of the latched value, where the * would correspond to the particular latch using the structure of latch 1501 (i.e., LAT_S for SDL, LAT_A for ADL, etc.). In FIG. 14B, the legs are connected between VDD and ground, but in some embodiments some of the latches can be connected to a different high level besides VDD. Connected in series between VDD and ground in the left leg of latch 1501 are PMOS 1513, PMOS 1517, and NMOS 1507, with the node LAT_* between PMOS 1517 and NMOS 1507. Connected in series between VDD and ground in the right leg of latch 1501 are PMOS 1511, PMOS 1515, and NMOS 1505, with the node INV_* between PMOS 1515 and NMOS 1505. To latch the stored value, the gates of PMOS 1517 and NMOS 1507 are cross-coupled to node INV_* and the gates of PMOS 1515 and NMOS 1505 are cross-coupled to node LAT_*. Both of LAT_* and INV_* are connectable to the local bus, LBUS (e.g., local bus 1456, 1458) by way of respective NMOS switch 1509 or 1503, so that either the value latched on LAT_* or its invers INV_* can be provided to the LBUS.

The latch 1551 of FIG. 14C can constructed similarly to latch 1501 of FIG. 14B, with a left leg of series connected PMOS 1563, PMOS 1567, NMOS 1557 and NMOS 1559, with the node LAT_X between PMOS 1567 and NMOS 1557; a right leg of series connected PMOS 1561, PMOS 1565, and NMOS 1555, with the node INV_X between PMOS 1565 and NMOS 1555; and the gates of PMOS 1567 and NMOS 1557 are cross-coupled to node INV_X and the gates of PMOS 1565 and NMOS 1555 are cross-coupled to node LAT_X, which is connected to XBUS through paired NMOS 1555 and PMOS 1552. In this embodiment, DBUS is connectable to INV_X by NMOS switch 1553 and DBUS may be connectable through another switch (not shown) to a local bus of multiple planes (e.g., local bus 1456 or local bus 1458).

FIG. 14D shows an example of a circuit 1571 that may be used to implement a Dynamic DL (e.g., Dynamic DLs 1012, 1014 of FIG. 10, Dynamic DLs 1234, 1236, 1238, 1240 of FIG. 12 or DynDLs of FIG. 14A). Circuit 1571 includes NMOS 1573 and NMOS 1575 connected to LBUS. NMOS 1573 connects to a first terminal of capacitor 1579. NMOS 1575 connects through NMOS 1577 to a second terminal of capacitor 1579. The gate of NMOS 1577 is connected to the first terminal of capacitor 1579. Capacitor 1579 can be charged or to hold one bit of data. Discharge of capacitor 1579 may cause stored data to become corrupted if it is not refreshed (read and reprogrammed) within a period of time. Because the Dynamic DL of circuit 1571 requires only three NMOS and a capacitor it may occupy a relatively small area of a die surface (e.g., significantly less than the 5 PMOS and 5 NMOS of latch 1551).

Memories that use a shared XDL that is shared between planes (with planes that may each include a Dynamic DL, e.g., as illustrated in the examples of FIGS. 10 and 12) may be operated in a manner that is adapted to the shared XDL, which may be different from operation of memories that include dedicated XDLs for each plane (e.g., as illustrated in the examples of FIGS. 9 and 11). For example, because each plane may not have a dedicated XDL, transfer of data to/from XDLs in parallel may not be Program operations may be adapted to efficiently use a shared XDL in various programming schemes, for example, as illustrated in the specific examples of FIGS. 15-17.

FIG. 15 illustrates an example of a programming scheme that includes some parallel operations. While this and other examples refer to a four-plane arrangement (e.g., as shown in FIG. 12), the techniques may be applicable to other arrangements including a two-plane arrangement (e.g., as shown in FIG. 10). Commands (e.g., from a memory controller) are shown on the top, a ready/busy signal ("BUSYn") in the middle and a state machine state during programming (Finite State Machine_Program, or "FSM_PROG") on the bottom (e.g., state of state machine 362).

Programming is initiated with a command ("80h"), an address in plane 0 ("Addr(P0)"), followed by the data to input to the shared XDL for P0/P2 1500 (e.g., shared XDL 1230), which in this example consists of 16 Kilobytes of data ("Data (16K)") and a command to switch planes ("16h"). Programming of the next data is then initiated with a command ("80h"), an address in plane 1 ("Addr(P1)"), followed by the data to input to the shared XDL for P1/P3 1502 (e.g., shared XDL 1232), which in this example consists of 16 Kilobytes of data ("Data (16K)") and a command to switch planes ("16h"). In parallel with the second set of commands, the state machine transitions from idle to preset and waits for charge pumps to charge up ("PRST" and "PUMP") followed by transfer of data from the shared XDL ("XDL transfer") 1504 to plane 0 ("P0 transfer only") e.g., transfer to an internal latch of plane 0 without transfer to connected plane 2). Transfer 1502 (e.g., to shared XDL 1232) and transfer 1504 (from shared XDL 1230) occur at least partially in parallel so that transfer 1504 does not increase overall programming time (e.g., transfer 1504 may be performed as a background operation while performing transfer 1502 in response to a corresponding command). Transfer 1504 from shared XDL 1230 makes shared XDL 1230 available for subsequent operations.

Subsequently, programming of the next data is initiated with a command ("80h"), an address in plane 2 ("Addr(P2)"), followed by the data to input to the shared XDL for P0/P2 1506 (e.g., shared XDL 1230), which in this example consists of 16 Kilobytes of data ("Data (16K)") and a command to switch planes ("16h"). In parallel, the state machine transitions from idle to preset and waits for charge pumps to charge up ("PRST" and "PUMP") followed by transfer of data from the shared XDL ("XDL transfer") 1508 to plane 1 ("P1 transfer only" e.g., transfer from shared XDL 1232 to an internal latch of plane 1 without transfer to connected plane 3). Transfer 1506 (e.g., to shared XDL 1230) and transfer 1508 (from shared XDL 1232) occur at least partially in parallel so that transfer 1508 does not increase overall programming time (e.g., transfer 1508 may be performed as a background operation while performing transfer 1506 in response to a corresponding command).

Subsequently, programming of the next data is initiated with a command ("80h"), an address in plane 3 ("Addr(P3)"), followed by the data to input to the shared XDL for P1/P3 1510 (e.g., shared XDL 1232), which in this example consists of 16 Kilobytes of data ("Data (16K)") and a command to switch planes ("16h"). In parallel, the state machine transitions from idle to preset and waits for charge pumps to charge up ("PRST" and "PUMP") followed by transfer of data from the shared XDL 1512 ("XDL transfer") to plane 2 ("P2 transfer only" e.g., transfer to an internal latch of plane 2 without transfer to connected plane 0). Transfer 1510 (e.g., to shared XDL 1232) and transfer 1512 (e.g., from shared XDL 1230) occur at least partially in parallel so that transfer 1512 does not increase overall programming time (e.g., transfer 1512 may be performed as a background operation while performing transfer 1510 in response to a corresponding command).

Subsequently, the state machine data transitions from idle to preset and waits for charge pumps to charge up ("PRST" and "PUMP") followed by transfer of data from the shared XDL 1514 ("XDL transfer") to plane 3 ("P3 transfer only" e.g., transfer from shared XDL 1232 to an internal latch of plane 3 without transfer to connected plane 1).

While the example of FIG. 15 uses parallel operation to provide a low overall programming time, certain ordering of data storage may not be practical in this scheme (e.g., programming plane 0 followed by plane 2, where planes 0 and 2 share a common XDL). In some cases, data may be reordered to facilitate storage according to the scheme used (e.g., the scheme of FIG. 15). In other examples, a different scheme may be used that facilitates different ordering.

FIG. 16 shows another example of a programming scheme that allows programming of planes in any order (e.g., programming of two planes that share a common XDL in succession). Programming is initiated with a command ("80h"), an address in plane 0 ("Addr(P0)"), followed by the data to input to the shared XDL for P0/P2 1620 (e.g., shared XDL 1230), which in this example consists of 16 Kilobytes of data ("Data (16K)") and a command to switch planes ("1Ah"). Subsequently, the state machine data transitions from idle to preset and waits for charge pumps to charge up ("PRST" and "PUMP") followed by transfer of data from the shared XDL 1622 ("XDL transfer") to plane 0 ("P0 transfer only" e.g., transfer to an internal latch of plane 0 without transfer to connected plane 2). Thus, transfer 1620 of data into a shared XDL is followed by transfer 1622 of the data from the same shared XDL (e.g., shared XDL 1230) to an internal data latch of the corresponding plane, which makes the shared XDL available for subsequent operations including operations directed to the same plane or a plane sharing the same shared XDL.

Subsequently, programming of the next data is initiated with a command ("80h"), an address in plane 2 ("Addr(P2)"), followed by the data to input to the shared XDL for P0/P2 1624 (e.g., shared XDL 1230), which in this example consists of 16 Kilobytes of data ("Data (16K)") and a command to switch planes ("1Ah"). Subsequently, the state machine data transitions from idle to preset and waits for charge pumps to charge up ("PRST" and "PUMP") followed by transfer of data from the shared XDL 1626 ("XDL transfer") to plane 2 ("P2 transfer only" e.g., transfer to an internal latch of plane 2 without transfer to connected plane 0). Thus, transfer 1624 of data into a shared XDL is followed by transfer 1626 of data from the same shared XDL (e.g., shared XDL 1230) to an internal data latch of the corresponding plane, which makes the shared XDL available for subsequent operations.

Subsequently, programming of the next data is initiated with a command ("80h"), an address in plane 3 ("Addr(P3)"), followed by the data to input to the shared XDL for P1/P3 1628 (e.g., shared XDL 1232), which in this example consists of 16 Kilobytes of data ("Data (16K)") and a command to switch planes ("1Ah"). Subsequently, this data may be transferred from the shared XDL to an internal latch in plane 3, which makes the shared XDL available for subsequent operations. Because transfer of data from shared XDLs to internal data latches occurs in series with transfer of data into the shared XDLs, overall programming time may be increased compared with the example of FIG. 15. Any order of programming planes may be implemented using the scheme of FIG. 16.

FIG. 17 shows another example of a programming scheme that may be implemented using shared XDLs that are shared between two planes. Programming is initiated with a command ("80h"), an address in plane 0 ("Add(P0)"), followed by the data to input to the shared XDL for P0/P2 1730 (e.g., shared XDL 1230), which in this example consists of 16 Kilobytes of data ("Data (16K)") and a command to switch planes ("11h"). Programming of subsequent data is initiated with a command ("80h"), an address in plane 1 ("Add(P1)"), followed by the data to input to the shared XDL for P1/P3 1732 (e.g., shared XDL 1232), which in this example consists of 16 Kilobytes of data ("Data (16K)") and a command to switch planes ("11h"). Subsequently, the state machine transitions from idle to preset and waits for charge pumps to charge up ("PRST" and "PUMP") followed by transfer of data from the shared XDLs 1734 ("XDL XFER") to plane 0 and plane 1 in parallel ("P0/P1 transfer" e.g., transfer to internal latches of plane 0 and plane 1 from respective shared XDLs). Programming of the next data is initiated with a command ("80h"), an address in plane 2 ("Add(P2)"), followed by the data to input to the shared XDL for P0/P2 1736 (e.g., shared XDL 1230), which in this example consists of 16 Kilobytes of data ("Data (16K)") and a command to switch planes ("11h"). Programming of subsequent data is initiated with a command ("80h"), an address in plane 3 ("Add(P3)"), followed by the data to input to the shared XDL for P1/P3 1738 (e.g., shared XDL 1232), which in this example consists of 16 Kilobytes of data ("Data (16K)") and one or more execution command ("1Ah/

10h/15h"). Subsequently, the state machine transitions from idle to preset and waits for charge pumps to charge up ("PRST" and "PUMP") followed by transfer of data from the shared XDLs 1740 ("XDL XFER") to plane 2 and plane 3 in parallel ("P2/P3 transfer" e.g., transfer to internal latches of plane 2 and plane 3 from respective shared XDLs). Because transfer from shared XDLs occurs in parallel for two planes, this scheme may have a lower overall programming time compared with the example of FIG. 16. Certain plane programming orders may not be compatible with the scheme of FIG. 17.

While the examples of FIGS. 15-17 show three programming schemes, other programming schemes may be implemented using shared XDLs. In some examples, different programming schemes may be used in the same memory at different times and/or in different portions of a memory at the same time (e.g., the schemes of FIG. 15 or 17 may be used to reduce overall programming time while at other times/locations the scheme of FIG. 16 may be used to accommodate a plane programming order without reordering of data). A storage system may be configured to switch between programming schemes in response to a command from a host, an order of receiving data from a host, a change in configuration, or otherwise.

Read operations may be adapted to efficiently use a shared XDL in various read schemes, for example, as illustrated in the specific example of FIG. 18. In some cases, a shared XDL may present problems with reading planes in certain orders. For example, in some multi-plane memories, read operations may include sensing multiple planes (e.g., obtaining data state information from memory cells and storing it in internal latches of corresponding planes) followed by transferring the data from internal latches to corresponding dedicated XDLs in each plane. Where XDLs are shared, such parallel transfer and storage may cause conflict (e.g., a shared XDL may not store data for two planes at the same time). In some cases, read operations may be ordered to ensure that such conflicts are avoided. However, this may not be desirable in all situations and read schemes that can accommodate different read orders may be desirable.

FIG. 18 illustrates an example of a read scheme that may be implemented in a memory that includes shared XDLs including shared XDL 1230 that is shared by plane 0 and plane 2 (e.g., as illustrated in FIG. 12). The top portion shows commands and other bus activity, the middle portion shows a ready/busy signal for plane 0 ("P0Busyn") with plane specific operations for plane 0 and the bottom portion shows a ready/busy signal for plane 2 ("P2Busyn") with plane specific operations for plane 2. A read of plane 0 is initiated by a read command ("00h") and address in plane 0 ("Addr(P0)") followed by command "30h" indicating reading of data into an internal data latch of P0 (e.g., any one of SDL, TDL, ADL, BDL, CDL or a Dynamic DL, if provided). This causes P0Busyn to go low and a read sensing ("Read") to be performed in plane 0 resulting in sensed data being stored in an internal data latch 1840 ("DL") in plane 0. Subsequent to the plane 0 commands, a read of plane 2 (which shares shared XDL 1230 with plane 0) is initiated by a read command ("00h") and address in plane 2 ("Addr(P2)") followed by command "30h" indicating reading of data into an internal data latch of P2 (e.g., any one of SDL, TDL, ADL, BDL, CDL or a Dynamic DL, if provided). This causes P2Busyn to go low and a read sensing ("Read") to be performed in plane 2 resulting in sensed data being stored in an internal data latch 1842 ("DL") in plane 2.

With sensed data for plane 0 in an internal DL 1840, a register read command and address ("05h, Addr(P0), E0h") are sent to indicate transfer of the data from the internal DL of plane 0 to shared XDL 1230 and from the shared XDL to IO pads 902. This causes P0Busyn to go low, a charge pump to initiate ("pump"), transfer of data from DL 1840 to shared XDL 1230 ("DL/XDL"), followed by prefetching ("prefch") and transfer of data out of shared XDL 1230 ("DataOut" 1844) on bus 906. After transfer 1844, shared XDL 1230 is available for other data. A subsequent register read command and address ("05h, Addr(P2), E0h") are sent to indicate transfer of the data from the internal DL of plane 2 to shared XDL 1230 and from the shared XDL to IO pads 902. This causes P2Busyn to go low, a charge pump to initiate ("pump"), transfer of data from DL 1842 to shared XDL 1230 ("DL/XDL"), followed by prefetching ("prefch") and transfer of data out of shared XDL 1230 ("DataOut" 1846) on bus 906. Because data is held in internal data latches (DLs 1840, 1842) and then sequentially transferred out by plane-specific commands, conflicts are avoided even where successive reads are directed to planes that share a shared XDL. While any internal data latch of planes 0 may be used as DL 1840 and any internal data latch of plane 2 may be used as DL1842, in some cases use of SDL may be convenient and may reduce transfer of data. In some cases, SDL may be used for other purposes, and it may not be desirable to use it for the read operations of FIG. 18. In some cases, Dynamic DLs 1234, 1238 may be used as DLs 1840 and 1842. This may require transfer to shared XDL 1230 within a predetermined time or use of one or more refresh operation (e.g., periodic refresh operations while data is in Dynamic latches).

Read operations as illustrated in FIG. 18 may be compatible with various other memory operations including programming operations that may be suspended to allow reading of data during suspension of a programming operation. For example, in what may be referred to as an Auto-Suspend, Auto-Resume (ASAR) operation, a cache ready/busy signal may go high indicating availability of an XDL at some intermediate point during a programming operation. A read and address sequence (e.g., "00h, Addr(P0), 30h") may then be received causing suspension of the programming operation and causing reading of data into an internal data latch (e.g., as illustrated in FIG. 18). Subsequently, the program operation may resume, and a register read sequence (e.g., "05h, Addr(P0), E0h") may be received, which may cause data to be transferred out of the internal DL in parallel with resumed programming. Where SDL is used for reading (e.g., as DL 1840, 1842), transfer of data from SDL to a shared XDL may require establishing breakpoints to avoid conflicts with data latch operations associated with programming. Where Dynamic DLs (e.g., Dynamic DLs 1234, 1238) are used for reading, data can be transferred from Dynamic DLs to a shared XDL without conflicts.

In another example, which may be referred to as Auto-Suspend, Manual-Resume (ASMR), suspended programming does not automatically resume and instead only resumes when a resume command is received. In this example, multiple reads may be performed (e.g., reads of different planes) while a program command is suspended. Any internal data latch (e.g., SDL, Dynamic DL or other) may be used without conflicts because programming does not resume until a specific resume command is received.

In some examples of read operations, data may be sensed and stored in an internal data latch in response to a first read command, then transferred to an XDL when a second read command is received, and the data for the first read may be transferred out of an XDL (e.g., to IO pads) in parallel with the second sense operation. Where an XDL is shared between planes, breakpoints may be defined to allow latch-to-latch transfers for both reads to occur without conflict. In some cases, Dynamic DLs (e.g., Dynamic DLs 1234, 1238) may be used keep read results to facilitate different usage cases.

Figure 19:
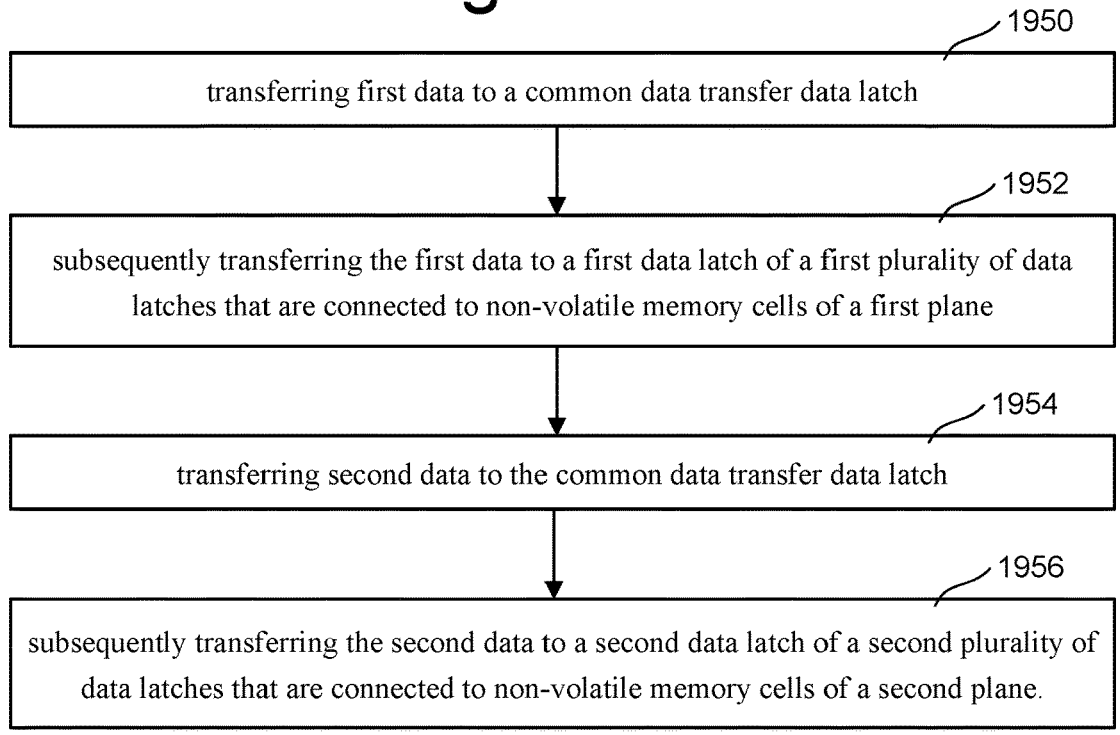
FIG. 19 shows an example of a method of operation that uses shared data transfer latches.

FIG. 19 shows an example of a method that may be implemented in a data storage system (e.g., a data storage system as described in any of the examples above that include one or more shared transfer data latches such as shared XDLs 1010, 1230 and 1232). The method includes transferring first data to a shared data transfer data latch 1950 (e.g., from bus 906 to shared XDL 1230) and subsequently transferring the first data to a first data latch of a first plurality of data latches that are connected to non-volatile memory cells of a first plane 1952 (e.g., to any internal data latch of plane 0, such as ADL, BDL, CDL, TDL, SDL or Dynamic DL 1234). The method further includes transferring second data to the shared data transfer data latch 1954 (e.g., from bus 906 to shared XDL 1230) and subsequently transferring the second data to a second data latch of a second plurality of data latches that are connected to non-volatile memory cells of a second plane 1956 (e.g., to any internal data latch of plane 2, such as ADL, BDL, CDL, TDL, SDL or Dynamic DL 1238).

Figure 20:
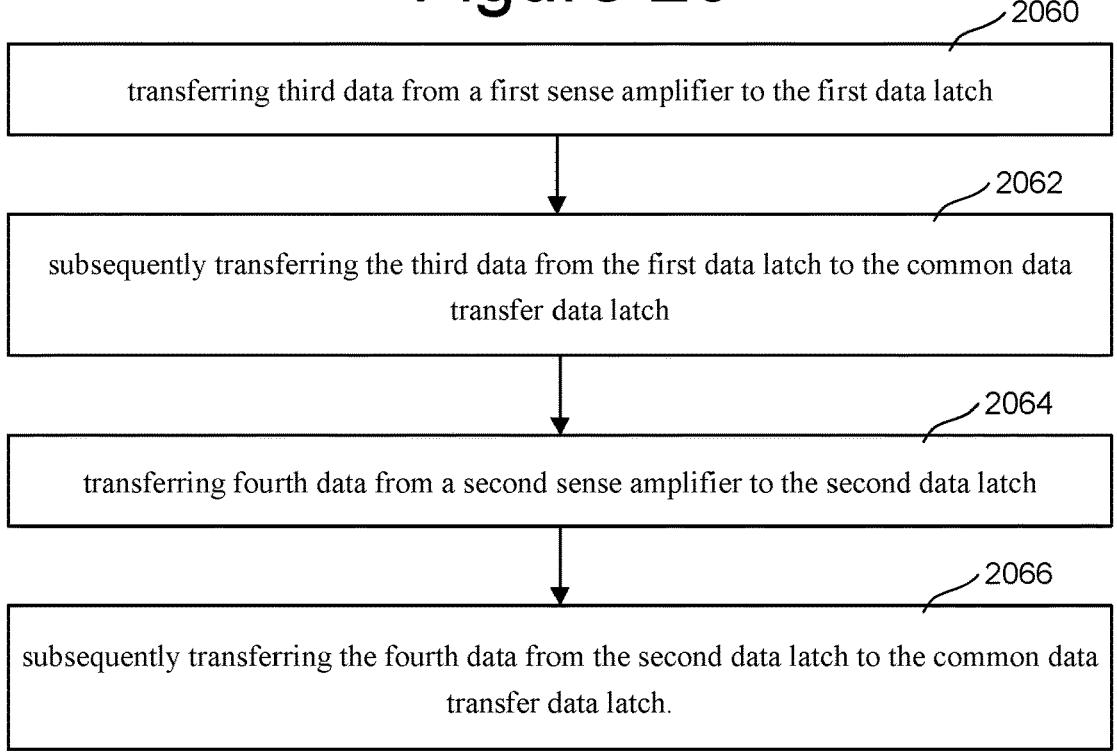
FIG. 20 shows another example of a method of operation that uses shared data transfer latches.

FIG. 20 shows another example of a method that may be implemented in a data storage system (e.g., a data storage system as described in any of the examples above that include one or more shared transfer data latches such as shared XDLs 1010, 1230 and 1232). The methods of FIGS. 19 and 20 may be performed in the same data storage system (e.g., in response to different commands such as a program command and a read command respectively). The method includes transferring third data from a first sense amplifier to the first data latch 2060 (e.g., from SA of plane 0 to an internal DL of plane 0) and subsequently transferring the third data from the first data latch to the shared data transfer data latch 2062 (e.g., from the internal DL of plane 0 to shared XDL 1230). The method also includes transferring fourth data from a second sense amplifier to the second data latch 2064 (e.g., from SA of plane 2 to an internal DL of plane 2) and subsequently transferring the fourth data from the second data latch to the shared data transfer data latch 2066 (e.g., from the internal DL of plane 2 to shared XDL 1230).

An example of an apparatus includes a control circuit configured to connect to an array of non-volatile memory cells. The control circuit includes a first plurality of data latches configured to connect to non-volatile memory cells of a first plane; a second plurality of data latches configured to connect to non-volatile memory cells of a second plane; and a shared data transfer data latch configured for transfer of data with the first plurality of data latches and the second plurality of data latches.

The apparatus may include a first dynamic data latch connected to the first plurality of data latches and a second dynamic data latch connected to the second plurality of data latches. The first dynamic data latch may be configured for transfer of data with the shared data transfer data latch and with the first plurality of data latches; and the second dynamic data latch may be configured for transfer of data with the shared data transfer data latch and with the second plurality of data latches. The apparatus may include a first local bus connecting the first plurality of data latches; and a second local bus connecting the second plurality of data latches. The apparatus may include a first dynamic data latch connected to the first local bus; and a second dynamic data latch connected to the second local bus. Each data latch of the first plurality of data latches, the second plurality of data latches and the shared data transfer data latch is a non-volatile data latch. The first dynamic data latch and second dynamic data latch may be volatile latches that require periodic refresh operations to maintain stored data. Each latch of the first plurality of data latches, the second plurality of data latches and the shared data transfer data latch may be larger than the first dynamic data latch and the second dynamic data latch. The first plurality of data latches may include at least five data latches including a first sense data latch configured to store a sensed bit from a first sense amplifier; and the second plurality of data latches may include at least five data latches including a second sense data latch configured to store a sensed bit from a second sense amplifier. The control circuit may be formed on a first die and is configured to connect to the array formed on a second die.

An example of a method includes: transferring first data to a shared data transfer data latch; subsequently transferring the first data to a first data latch of a first plurality of data latches that are connected to non-volatile memory cells of a first plane; transferring second data to the shared data transfer data latch; and subsequently transferring the second data to a second data latch of a second plurality of data latches that are connected to non-volatile memory cells of a second plane.

The method may further include transferring the first data from the shared data transfer data latch to a first dynamic data latch; and transferring the first data from the first dynamic data latch to the first data latch. The method may further include transferring the second data from the shared data transfer data latch to a second dynamic data latch; and transferring the second data from the second dynamic data latch to the second data latch. The method may further include refreshing at least one of the first data in the first dynamic data latch and the second data in the second dynamic data latch. The method may further include transferring third data from a first sense amplifier to the first data latch; subsequently transferring the third data from the first data latch to the shared data transfer data latch; transferring fourth data from a second sense amplifier to the second data latch; and subsequently transferring the fourth data from the second data latch to the shared data transfer data latch. The method may include transferring the third data from the shared data transfer data latch to a memory controller; and transferring the fourth data from the shared data transfer data latch to the memory controller.

An example of a non-volatile memory device includes a plurality of non-volatile memory cells arranged in a plurality of planes including at least a first plane and a second plane; and a control circuit configured to connect to the plurality of non-volatile memory cells, the control circuit comprising: a first plurality of data latches configured to connect to non-volatile memory cells of a first plane; a second plurality of data latches configured to connect to non-volatile memory cells of a second plane; and means for latching data for transfer to and from the first plurality of data latches and the second plurality of data latches.

The non-volatile memory device may include first means for volatile storage of data, the first means for volatile storage of data connected to the first plurality of data latches; and second means for volatile storage of data, the second means for volatile storage of data connected to the second plurality of data latches. The plurality of non-volatile memory cells may be formed on a first die and the control circuit is formed on a second die.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
    a control circuit configured to connect to an array of non-volatile memory cells, the control circuit comprising:
        a first plurality of data latches configured to connect to non-volatile memory cells of a first plane;
        a second plurality of data latches configured to connect to non-volatile memory cells of a second plane; and
        a shared data transfer data latch configured for transfer of data with the first plurality of data latches and the second plurality of data latches.

2. The apparatus of claim 1, further comprising a first dynamic data latch connected to the first plurality of data latches and a second dynamic data latch connected to the second plurality of data latches.

3. The apparatus of claim 2, wherein:
    the first dynamic data latch is configured for transfer of data with the shared data transfer data latch and with the first plurality of data latches; and
    the second dynamic data latch is configured for transfer of data with the shared data transfer data latch and with the second plurality of data latches.

4. The apparatus of claim 1, further comprising:
    a first local bus connecting the first plurality of data latches; and
    a second local bus connecting the second plurality of data latches.

5. The apparatus of claim 4, further comprising:
    a first dynamic data latch connected to the first local bus; and
    a second dynamic data latch connected to the second local bus.

6. The apparatus of claim 5, wherein each data latch of the first plurality of data latches, the second plurality of data latches and the shared data transfer data latch is a non-volatile data latch.

7. The apparatus of claim 6, wherein the first dynamic data latch and second dynamic data latch are volatile latches that require periodic refresh operations to maintain stored data.

8. The apparatus of claim 7, wherein each latch of the first plurality of data latches, the second plurality of data latches and the shared data transfer data latch is larger than the first dynamic data latch and the second dynamic data latch.

9. The apparatus of claim 1, wherein:
    the first plurality of data latches includes at least five data latches including a first sense data latch configured to store a sensed bit from a first sense amplifier; and
    the second plurality of data latches includes at least five data latches including a second sense data latch configured to store a sensed bit from a second sense amplifier.

10. The apparatus of claim 1, wherein the control circuit is formed on a first die and is configured to connect to the array formed on a second die.

11. A method, comprising:
    transferring first data to a shared data transfer data latch;
    subsequently transferring the first data to a first data latch of a first plurality of data latches that are connected to non-volatile memory cells of a first plane;
    transferring second data to the shared data transfer data latch; and
    subsequently transferring the second data to a second data latch of a second plurality of data latches that are connected to non-volatile memory cells of a second plane.

12. The method of claim 11, further comprising:
    transferring the first data from the shared data transfer data latch to a first dynamic data latch; and
    transferring the first data from the first dynamic data latch to the first data latch.

13. The method of claim 12, further comprising:
    transferring the second data from the shared data transfer data latch to a second dynamic data latch; and
    transferring the second data from the second dynamic data latch to the second data latch.

14. The method of claim 13, further comprising: refreshing at least one of the first data in the first dynamic data latch and the second data in the second dynamic data latch.

15. The method of claim 11, further comprising:
    transferring third data from a first sense amplifier to the first data latch;
    subsequently transferring the third data from the first data latch to the shared data transfer data latch;
    transferring fourth data from a second sense amplifier to the second data latch; and
    subsequently transferring the fourth data from the second data latch to the shared data transfer data latch.

16. The method of claim 15, further comprising:
    transferring the third data from the first data latch to a first dynamic data latch;
    subsequently transferring the third data from the first dynamic data latch to the shared data transfer data latch;
    transferring the fourth data from the second data latch to a second dynamic data latch; and subsequently transferring the fourth data from the second dynamic data latch to the shared data transfer data latch.

17. The method of claim 16, further comprising:
transferring the third data from the shared data transfer data latch to a memory controller; and
transferring the fourth data from the shared data transfer data latch to the memory controller.

18. A non-volatile memory device, comprising:
a plurality of non-volatile memory cells arranged in a plurality of planes including at least a first plane and a second plane; and
a control circuit configured to connect to the plurality of non-volatile memory cells, the control circuit comprising:
   a first plurality of data latches configured to connect to non-volatile memory cells of a first plane;
   a second plurality of data latches configured to connect to non-volatile memory cells of a second plane; and
   means for latching data for transfer to and from the first plurality of data latches and the second plurality of data latches.

19. The non-volatile memory device of claim 18, further comprising:
first means for volatile storage of data, the first means for volatile storage of data connected to the first plurality of data latches; and
second means for volatile storage of data, the second means for volatile storage of data connected to the second plurality of data latches.

20. The non-volatile memory device of claim 18, wherein the plurality of non-volatile memory cells are formed on a first die and the control circuit is formed on a second die.

* * * * *